(12) United States Patent
Moriwaka

(10) Patent No.: US 7,795,114 B2
(45) Date of Patent: Sep. 14, 2010

(54) MANUFACTURING METHODS OF SOI SUBSTRATE AND SEMICONDUCTOR DEVICE

(75) Inventor: Tomoaki Moriwaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 131 days.

(21) Appl. No.: 12/219,650

(22) Filed: Jul. 25, 2008

(65) Prior Publication Data

US 2009/0042362 A1 Feb. 12, 2009

(30) Foreign Application Priority Data

Aug. 10, 2007 (JP) .............................. 2007-208932

(51) Int. Cl.
H01L 21/30 (2006.01)

(52) U.S. Cl. ...................... 438/458; 438/406; 438/459; 438/479; 257/E21.561; 257/E21.568; 257/E21.32

(58) Field of Classification Search ................ 438/458, 438/406, 459, 479; 257/E21.561, E21.568, 257/E21.32

See application file for complete search history.

(56) References Cited

U.S. PATENT DOCUMENTS

| | | | |
|---|---|---|---|
| 6,372,609 B1 | 4/2002 | Aga et al. | |
| 6,380,046 B1 | 4/2002 | Yamazaki | |
| 6,534,380 B1 | 3/2003 | Yamauchi et al. | |
| 6,818,529 B2 | 11/2004 | Bachrach et al. | |
| 7,115,481 B2 * | 10/2006 | Ghyselen et al. | 438/458 |
| 7,119,365 B2 | 10/2006 | Takafuji et al. | |
| 7,199,024 B2 | 4/2007 | Yamazaki | |
| 7,199,397 B2 | 4/2007 | Huang et al. | |
| 2003/0162346 A1 | 8/2003 | Srinivasan | |
| 2003/0183876 A1 | 10/2003 | Takafuji et al. | |
| 2004/0061176 A1 | 4/2004 | Takafuji et al. | |
| 2004/0229444 A1 * | 11/2004 | Couillard et al. | 438/455 |
| 2006/0084249 A1 | 4/2006 | Yamada | |
| 2007/0141802 A1 | 6/2007 | Gadkaree | |
| 2007/0173000 A1 | 7/2007 | Yamazaki | |
| 2007/0281399 A1 | 12/2007 | Cites et al. | |
| 2008/0248629 A1 | 10/2008 | Yamazaki | |

FOREIGN PATENT DOCUMENTS

| | | |
|---|---|---|
| JP | 64-061943 | 3/1989 |
| JP | 06-018926 | 1/1994 |
| JP | 11-163363 | 6/1999 |
| JP | 2000-012864 | 1/2000 |
| JP | 2003-068592 | 3/2003 |
| JP | 2003-324188 | 11/2003 |
| JP | 2004-134675 | 4/2004 |
| WO | WO 2004/025360 | 3/2004 |

* cited by examiner

*Primary Examiner*—Thanh V Pham
*Assistant Examiner*—Maria Ligai
(74) *Attorney, Agent, or Firm*—Eric J. Robinson; Robinson Intellectual Property Law Office, P.C.

(57) ABSTRACT

A manufacturing method of an SOI substrate and a manufacturing method of a semiconductor device are provided. When a large-area single crystalline semiconductor film is formed over an enlarged substrate having an insulating surface, e.g., a glass substrate by an SOI technique, the large-area single crystalline semiconductor film is formed without any gap between plural single crystalline semiconductor films, even when plural silicon wafers are used. An aspect of the manufacturing method includes the steps of disposing a first seed substrate over a fixing substrate; tightly arranging a plurality of single crystalline semiconductor substrates over the first seed substrate to form a second seed substrate; forming a large-area continuous single crystalline semiconductor film by an ion implantation separation method and an epitaxial growth method; forming a large-area single crystalline semiconductor film without any gap over a large glass substrate by an ion implantation separation method again.

14 Claims, 15 Drawing Sheets

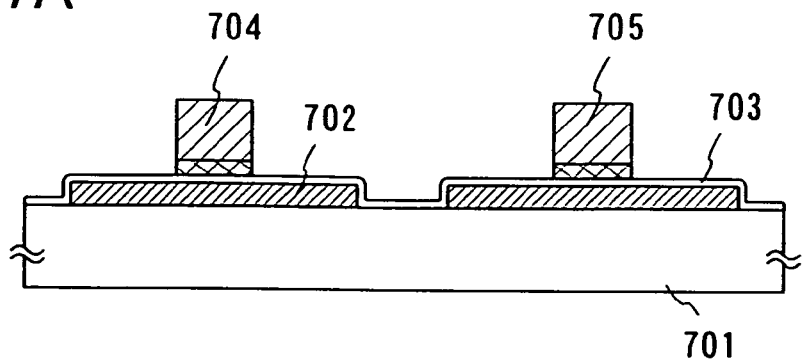
FIG. 7A
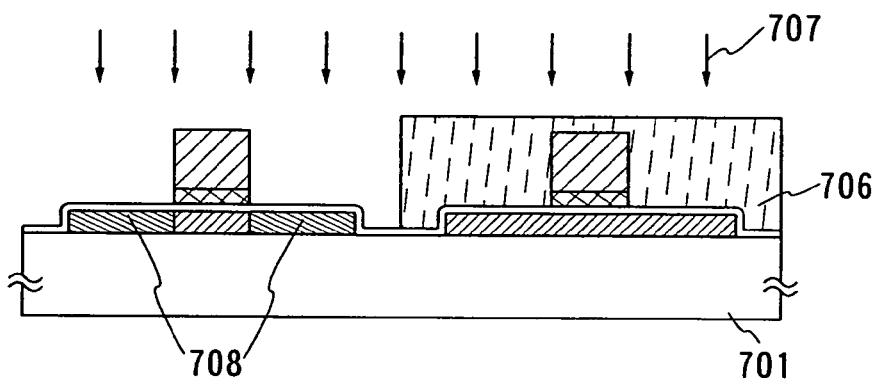
FIG. 7B
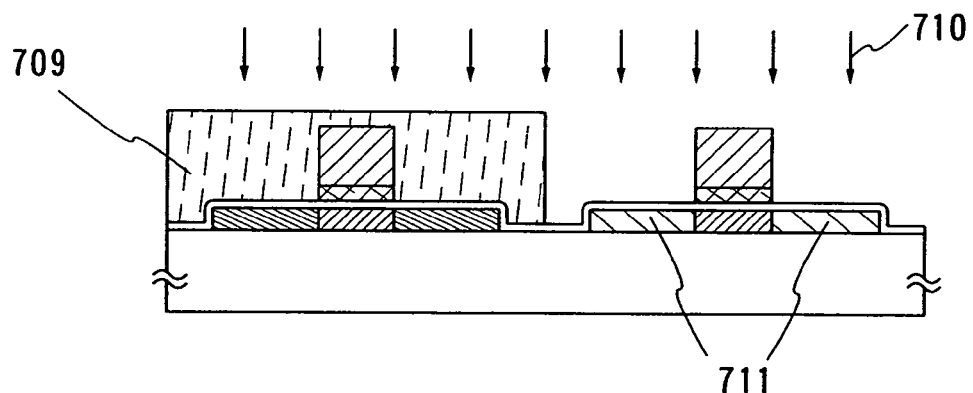
FIG. 7C
FIG. 7D
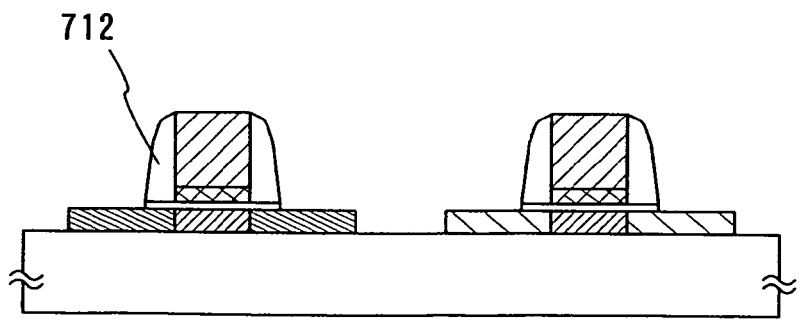

MANUFACTURING METHODS OF SOI SUBSTRATE AND SEMICONDUCTOR DEVICE

BACKGROUND OF THE INVENTION

1. Field of the Invention

The present invention relates to a manufacturing method of a silicon-on-insulator (SOI) substrate and a manufacturing method of a semiconductor device using the SOI substrate. In particular, the present invention relates to a technique by which a large area single crystalline semiconductor film is formed over a substrate having an insulating surface such as glass by an SOI bonding technique.

2. Description of the Related Art

In recent years, a technique for forming a semiconductor device such as a thin film transistor (TFT) using a semiconductor thin film (the thickness of several nanometers to several hundreds nanometers) formed over a substrate having an insulating surface such as glass has been attracted. Thin film transistors are widely applied to electronic devices such as an IC and an electro-optical device. In particular, urgent development is required on thin film transistors as switching elements of image display devices.

In addition, instead of silicon wafers formed by thinly slicing a single crystalline semiconductor ingot, which are widely used in manufacture of semiconductor devices, semiconductor substrates called silicon-on-insulator (SOI) substrates that each has a thin single crystalline semiconductor layer over an insulating surface have been developed. An integrated circuit using an SOI substrate has been attracting attentions, because parasitic capacitance between a drain of a transistor and the substrate can be reduced and performance of a semiconductor integrated circuit can be enhanced.

As a method for manufacturing such SOI substrates, an ion implantation separation method is known. For example, ions of hydrogen or the like are implanted to a silicon wafer provided with a silicon oxide film on its surface to form a microbubble layer serving as a cleavage plane at a predetermined depth from the surface, and the silicon wafer is bonded to another silicon wafer. Then, heat treatment is performed to separate a thin single crystalline semiconductor film (SOI film) at the cleavage plane, and an SOI layer substrate is formed.

Further, a method for forming an SOI film over a substrate having an insulating surface, e.g., a glass substrate, has been attempted. One example of semiconductor devices using SOI substrates is disclosed by the present assignee (see Reference 1: Japanese Published Patent Application No. 2000-12864).

SUMMARY OF THE INVENTION

As described above, by development of SOI technique, it is possible to form a single crystalline semiconductor film over an insulating substrate having a larger size than a silicon wafer. In addition, as a screen of a semiconductor device typified by a liquid crystal display is larger, a glass substrate is also larger and larger. However, the size of a silicon wafer is dependent on a manufacturing method thereof, and is limited unfortunately.

Accordingly, when a large-size glass substrate is used in SOI technique, a plurality of single crystalline semiconductor films, which are obtained by separation from a silicon wafer, are bonded to one glass substrate. As a result, there is a problem in that a gap between a single crystalline semiconductor film and another single crystalline semiconductor film adjacent thereto, which have been bonded to the glass substrate, and in the gap, no single crystalline semiconductor film exist.

The present invention has made in view of the above problem. Thus, it is an object of the present invention to provide a manufacturing method of an SOI substrate and a manufacturing method of a semiconductor device. In each manufacturing method, in a case where a large-area single crystalline semiconductor film is formed over an enlarged substrate having an insulating surface, e.g., a glass substrate, the large-area single crystalline semiconductor film is formed without having a gap between plural single crystalline semiconductor films, even when plural silicon wafers are used.

An aspect of the present invention is a manufacturing method of an SOI substrate, comprising steps of disposing a first seed substrate over a fixing substrate; tightly arranging a plurality of single crystalline semiconductor substrates over the first seed substrate to form a second seed substrate; forming a large-area continuous single crystalline semiconductor film by an ion implantation separation method and an epitaxial growth method; forming a large-area single crystalline semiconductor film over a large glass substrate by an ion implantation separation method again. Further, the present invention relates to a manufacturing method of a semiconductor device which comprises the steps of separating the obtained single crystalline semiconductor film over the manufactured SOI substrate to be isolated by element isolation, and forming a transistor using the isolated single crystalline semiconductor film.

In addition, it is necessary that a gap between the plural single crystalline semiconductor substrates constituting a part of the first seed substrate is not overlapped with a gap between the plural single crystalline semiconductor substrates constituting a part of the second seed substrate. Preferably, the center of the single crystalline semiconductor substrate constituting a part of the second seed substrate is located over a corner (so-called lattice point) of the single crystalline semiconductor substrate constituting a part of the first seed substrate. Also in the case where a fixing substrate is formed of single crystalline semiconductor substrates, it is necessary that a gap between the plural single crystalline semiconductor substrates constituting a part of the fixing substrate is not overlapped with the gap between plural single crystalline semiconductor substrates constituting a part of the first seed substrate. Preferably, the center of the single crystalline semiconductor substrate constituting a part of the first seed substrate is located over a corner (so called lattice point) of the single crystalline semiconductor substrate constituting a part of the fixing substrate.

In the present invention, by the ion implantation separation method, a second seed substrate having a first separation layer in which ions are implanted at a predetermined depth is bonded to a first seed substrate, and then is separated therefrom with the first separation layer used as a cleavage plane, whereby a single crystalline semiconductor film having a discontinuous portion can be formed. Further, a new single crystalline semiconductor film is formed by an epitaxial growth method using the single crystalline semiconductor film having a discontinuous portion and the first seed substrate as a seed, and thus a large-area continuous single crystalline semiconductor film can be formed. Then, by an ion implantation separation method, ions are implanted again at a predetermined depth of the large-area single crystalline semiconductor film to form a second separation layer and the large-area single crystalline semiconductor film is bonded to a large-area glass substrate. Then, the single crystalline semiconductor film is separated from the glass substrate with the second separation layer used as a cleavage plane, and thus a large-area single crystalline semiconductor film can be formed over the glass substrate.

A specific structure of the present invention is a manufacturing method of an SOI substrate, comprising the steps of arranging a first seed substrate constituted of a plurality of single crystalline semiconductor substrates over a fixing substrate so as to be bonded to the fixing substrate; arranging, over the first seed substrate, a second seed substrate constituted of a plurality of single crystalline semiconductor substrates each having a first separation layer which is formed by implantation of ions in a region at predetermined depth from a surface, so that the second seed substrate is bonded to the first seed substrate; conducting heat treatment in a state in which the first seed substrate and the second seed substrate are superimposed; generating a crack in the first separation layer of the second seed substrate, and separating the second seed substrate such that the plurality of first single crystalline semiconductor films which are a part of the second seed substrate are left over the first seed substrate; forming a second single crystalline semiconductor film crystallized by epitaxial growth so as to cover the first single crystalline semiconductor films and a gap between the first single crystalline semiconductor films; forming a second separation layer by implantation of ions in a region at a predetermined depth from a surface of a third single crystalline semiconductor film including the first single crystalline semiconductor films and the second single crystalline semiconductor films; superimposing a substrate having an insulating surface and the third single crystalline semiconductor film so as to be bonded with each other; conducting heat treatment in a state in which the third single crystalline semiconductor film and the substrate having the insulating surface are superimposed; generating a crack in the second separation layer; and separating the fixing substrate and the first seed substrate from the substrate having the insulating surface so that a part of the third single crystalline semiconductor film is left over the substrate having the insulating surface to form a fourth single crystalline semiconductor film over the substrate having the insulating surface.

In the above structure, the first seed substrate and the second seed substrate are both constituted of a plurality of single crystalline semiconductor substrates (silicon wafers) which are tightly arranged. However, the fixing substrate is not necessarily a single crystalline semiconductor substrate.

In a case where a single crystalline semiconductor substrate is used for a fixing substrate, the shape of the single crystalline semiconductor substrate may be circular or quadrangular (e.g., square, rectangle and the like), whereas the first seed substrate or the second seed substrate can be quadrangular (e.g., square, rectangle and the like).

In addition, the fixing substrate and the first seed substrate are each constituted of a plurality of tightly-arranged single crystalline semiconductor substrates which are the same in size, and a single crystalline semiconductor substrate constituting a part of the first seed substrate may be disposed to cover a gap between the single crystalline semiconductor substrates constituting a part of the fixing substrate.

Further, the first seed substrate and the second seed substrate are each constituted of a plurality of tightly-arranged single crystalline semiconductor substrates having the same size which are tightly arranged, and a single crystalline semiconductor substrate constituting a part of the second seed substrate may be disposed to cover a gap between the single crystalline semiconductor substrates constituting a part of the first seed substrate.

Note that as well as the above structure, a structure in which a bonding film is formed on the surface of each of the plurality of single crystalline semiconductor substrates constituting the fixing substrate, and the first seed substrate constituted of a plurality of single crystalline semiconductor substrates is bonded to the fixing substrate with the bonding film serving as a bonding layer therebetween is also included in the present invention.

The bonding film can be a silicon oxide film formed over the plurality of single crystalline semiconductor substrates constituting the fixing substrate, by a chemical vapor deposition method using an organic silane gas. In the case of using an organic silane gas, the following can be employed: tetraethoxysilane (TEOS, chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

According to the present invention, when a single crystalline semiconductor film is formed by SOI technique, a large-area single crystalline semiconductor film can be formed without any space between single crystalline semiconductor films. Thus, even if a substrate having an insulating surface is larger, a large-area continuous single crystalline semiconductor film in accordance with the expansion of the substrate size can be formed. Accordingly, an SOI substrate having a large-area single crystalline semiconductor film can be formed. In addition, by using an SOI substrate of the present invention, it is possible that a semiconductor device and the like with high speed driving, low power consumption and a large display portion is formed.

BRIEF DESCRIPTION OF THE DRAWINGS

In the accompanying drawings:

FIGS. 7A to 7D are cross-sectional views illustrating a manufacturing method of a semiconductor device according to an aspect of the present invention;

DETAILED DESCRIPTION OF THE INVENTION

Embodiment Mode

The embodiment modes according to the present invention will now be described with reference to the accompanying drawings. However, the present invention is not limited to description to be given below, and modes and details thereof can be variously modified without departing from the spirit and the scope of the present invention. Accordingly, the present invention should not be interpreted as being limited to the description of the embodiment modes to be given below.

Embodiment Mode 1

In Embodiment Mode 1, a manufacturing method of an SOI substrate according to the present invention is described with reference to FIGS. 1A to 1D, FIGS. 2A to 2D, FIGS. 3A to 3D and FIGS. 4A to 4D.

Figure 1A:
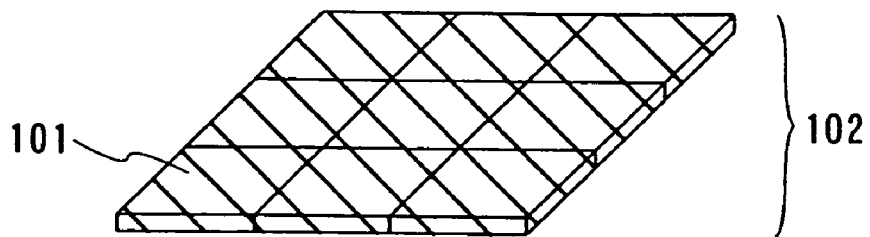
FIGS. 1A to 1D are cross-sectional views illustrating a manufacturing method of an SOI substrate according to an aspect of the present invention.

As illustrated in FIG. 1A, a plurality of silicon wafers 101 with the same thickness, obtained by slicing an ingot of a single crystalline semiconductor are tightly arranged without any space therebetween on a plane surface. In Embodiment Mode 1, nine silicon wafers 101 having a side of 5 inches are arranged to form a fixing substrate 102. Note that the number of the silicon wafers constituting the fixing substrate 102 is not limited to nine, and may be increased or decreased as appropriate. In addition, the shape of the silicon wafers constituting the fixing substrate 102 is not limited to a square shape, and may be circular or rectangular. Further, as a material of the fixing substrate 102, a silicon wafer is not a limiting example, and any material which can fix a first seed substrate to be formed next and can withstand a process temperature of a later step can be used.

Figure 1B:
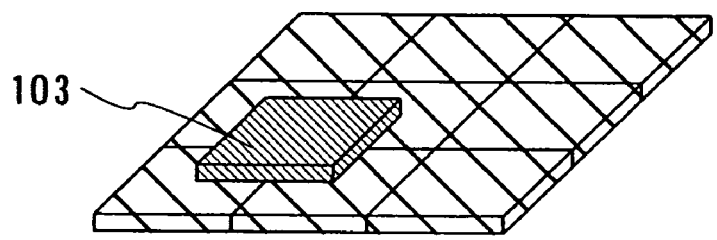

Then, as illustrated in FIG. 1B, a silicon wafer 103 is bonded to the fixing substrate 102. At this time, the silicon wafer 103 is arranged such that the center of the silicon wafer 103 is located over a corner (so called lattice point) of the silicon wafer 101 constituting a part of the fixing substrate 102. In Embodiment Mode 1, the silicon wafer 103 having the same size as the silicon wafer 101 is used.

Figure 1C:
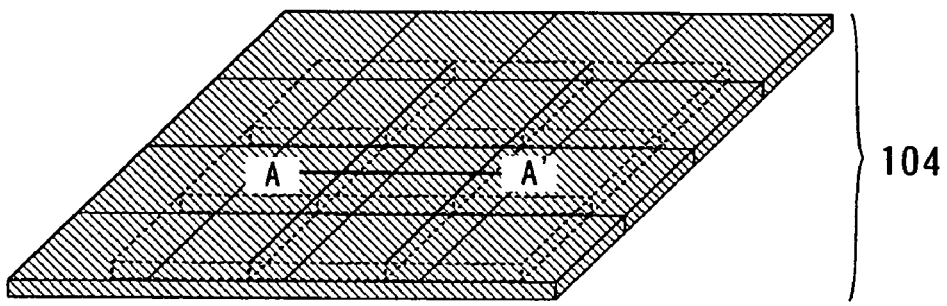

In this case, sixteen silicon wafers 103 are tightly arranged without any space therebetween over the fixing substrate 102 to form a first seed substrate 104 (FIG. 1C). In general, the surface of a silicon wafer is polished to be extremely planarized, and thus bonding of silicon wafers by superimposing the silicon wafers is easy. Accordingly, the fixing substrate 102 is bonded to the first seed substrate 104 in this embodiment mode, and the bonded silicon wafers can be regarded as one sheet of large silicon wafer.

In order to strengthen the bonding of the fixing substrate 102 and the first seed substrate 104, heat treatment and/or pressure treatment may be conducted. In addition, if an impurity such as an oxide film is attached onto the surface of the silicon wafer, the impurity is preferably removed before the bonding.

Figure 1D:
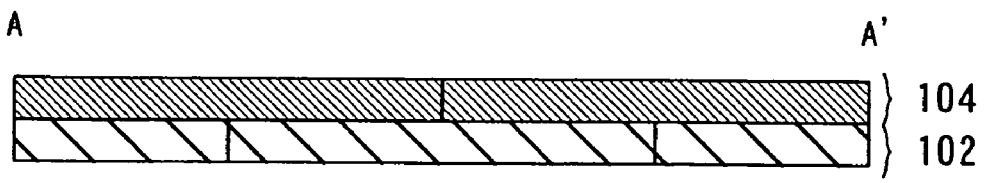

A cross-sectional view taken along the line A-A' in FIG. 1C is illustrated in FIG. 1D.

Figure 2A:
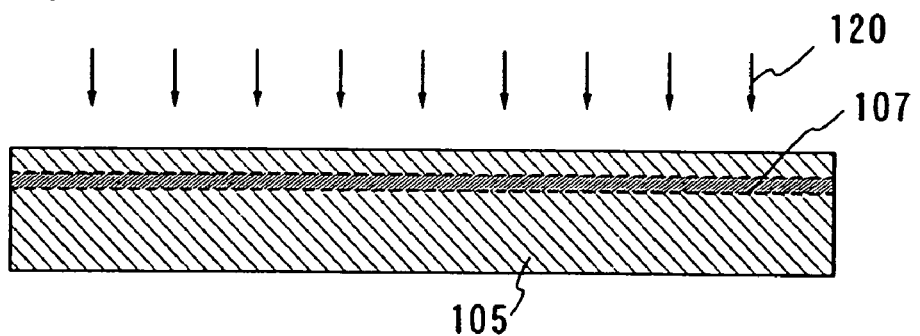
FIGS. 2A to 2D are cross-sectional views illustrating a manufacturing method of an SOI substrate according to an aspect of the present invention.

Then, as illustrated in FIG. 2A, ions 120 accelerated by an electric field are implanted to another silicon wafer at a predetermined depth (more than 0 to several micrometers) to form a first separation layer 107. The first separation layer 107 is formed by introducing ions of hydrogen, helium, or a halogen typified by fluorine. In this case, it is preferable to introduce one kind of ions or plural kinds of ions of different mass numbers consisting of a single kind of atoms. In Embodiment Mode 1, hydrogen ions are implanted to form the first separation layer 107 containing hydrogen.

In the case of introducing hydrogen ions, the hydrogen ions preferably include $H^+$, $H_2^+$, and $H_3^+$ ions with a high proportion of $H_3^+$ ions. In the case of introducing hydrogen ions, when the hydrogen ions are made to include $H^+$, $H_2^+$, and $H_3^+$ ions with a high proportion of $H_3^+$ ions, introduction efficiency can be increased and introduction time can be shortened. With this structure, separation at the first separation layer 107 can be easily performed later.

In addition, when it is necessary to introduce ions at a high dose, a surface of a silicon wafer may be damaged and roughened unfortunately. Thus, the surface to which ions are introduced can be provided with a protective film against ion introduction, whereby reduction of the planarity of the surface due to ion doping can be prevented. As the protective layer, for example, a silicon oxynitride film, a silicon nitride oxide film, or the like may be used.

Figure 2B:
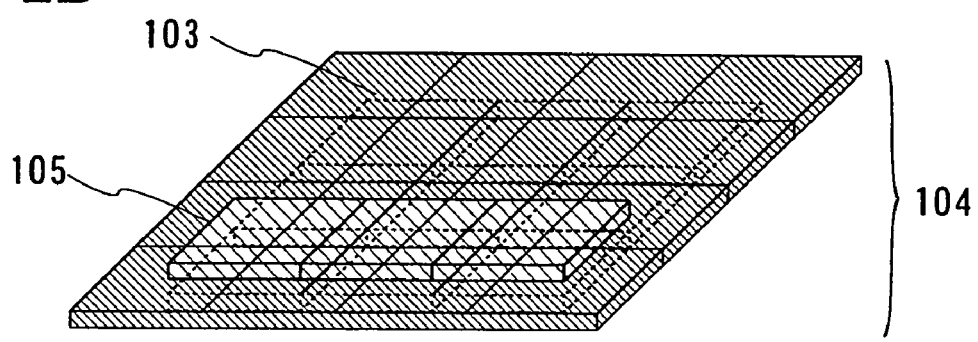

In Embodiment Mode 1, nine silicon wafers 105 having the above first separation layer 107 are prepared, and as illustrated in FIG. 2B, the silicon wafers 105 are bonded to the first seed substrate 104 illustrated in FIG. 1C. At this time, each of the silicon wafers 105 is arranged such that the center of the silicon wafer 105 is located over the corner (so-called lattice point) of the silicon wafer 103 constituting a part of the first seed substrate 104. Note that in Embodiment Mode 1, the silicon wafer 105 having the same size as the silicon wafer 101 and the silicon wafer 103 can be used.

Figure 2C:
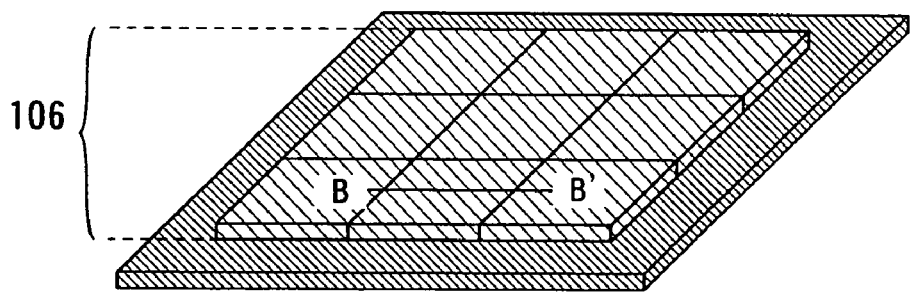

Nine silicon wafers 105 having the first separation layer 107 are tightly arranged without any space therebetween over the first seed substrate 104 such that the surface through which ions 120 have passed is in contact with the first seed substrate 104, thereby forming a second seed substrate 106 (FIG. 2C). At this time, the first seed substrate 104 and the second seed substrate 106 are firmly bonded to each other. Van der Waals forces act on the bonding, and the first seed substrate 104 and the second seed substrate 106 are formed by pressure bonding and thus a firm bonding due to hydrogen bonds can be obtained. Pressurization is conducted in consideration of withstand pressure of the first seed substrate 104 and the second seed substrate 106, such that a perpendicular pressure to the bonding surface is applied. In addition, if an impurity such as an oxide film is attached to the surface of the silicon wafer 105, the impurity is preferably removed, because the impurity may cause reduction of the bonding strength.

Figure 2D:
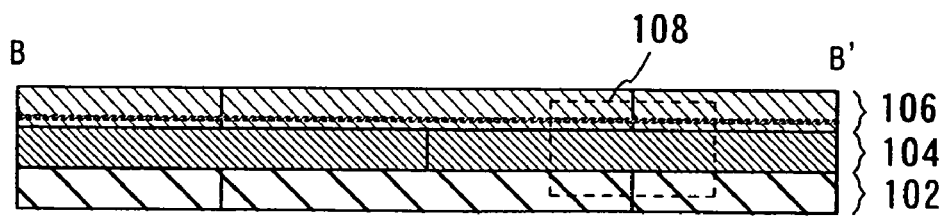

FIG. 2D illustrates a cross-sectional view taken along the line B-B' of FIG. 2C. In FIG. 2D, the first seed substrate 104 and the second seed substrate 106 are stacked in order over the fixing substrate 102. Further, an expanded view of a region denoted by a reference numeral 108 in FIG. 2D is illustrated in FIG. 3A.

Figure 3A:
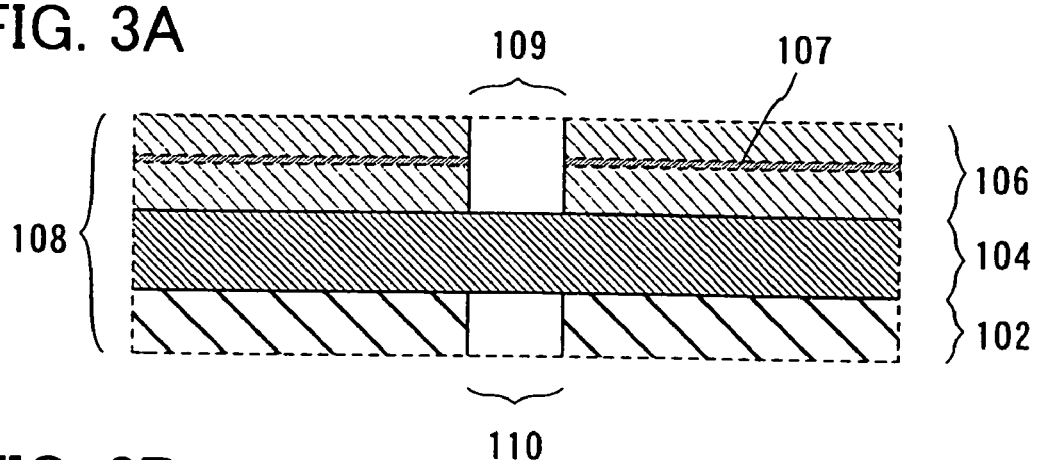
FIGS. 3A to 3D are cross-sectional views illustrating a manufacturing method of an SOI substrate according to an aspect of the present invention.

As illustrated in FIG. 3A, the fixing substrate 102, the first seed substrate 104 (not illustrated), and the second seed substrate 106, which are each constituted of a plurality of tightly-arranged silicon wafers, have gaps (109, 100) between the silicon wafers, in some degree.

Figure 3B:
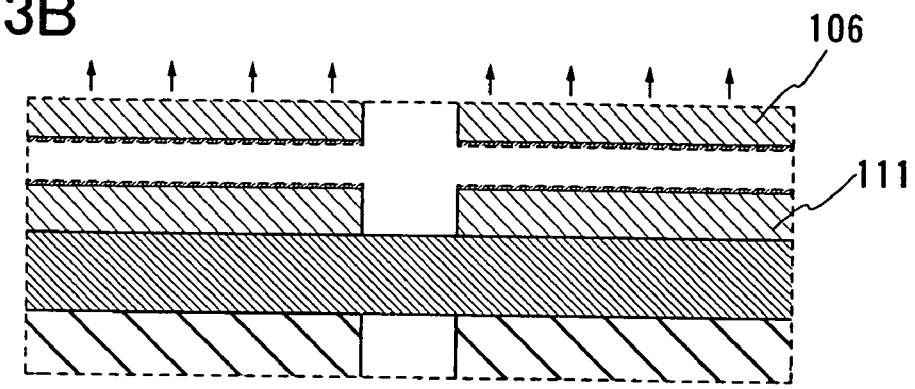

Next, a substrate illustrated in FIG. 2D, in which the fixing substrate 102, the first seed substrate 104, and the second seed substrate 106 are stacked, is heated. As a result, the second seed substrate 106 is separated, with the first separation layer 107 formed in the second seed substrate 106 as a cleavage plane. In this manner, a first single crystalline silicon film 111 having a thickness of several micrometers or less, which is a part of the second seed substrate 106, is formed over the first seed substrate 104 (FIG. 3B). In addition, voids, which are a part of the first separation layer 107, exist partially on the surface of the first single crystalline silicon film 111, and thus the surface is preferably polished to be planarized by a method such as chemical mechanical polishing (CMP).

However, as illustrated in an expanded view of FIG. 3A, in the second seed substrate 106, even when silicon wafers constituting the second seed substrate 106 are tried to be tightly arranged without any space therebetween, the gap 109 exists somehow and thus the first single crystalline silicon film 111 formed over the first seed substrate 104 is formed with the gap 109 with a neighboring single crystalline silicon film 111, similarly.

Figure 3C:
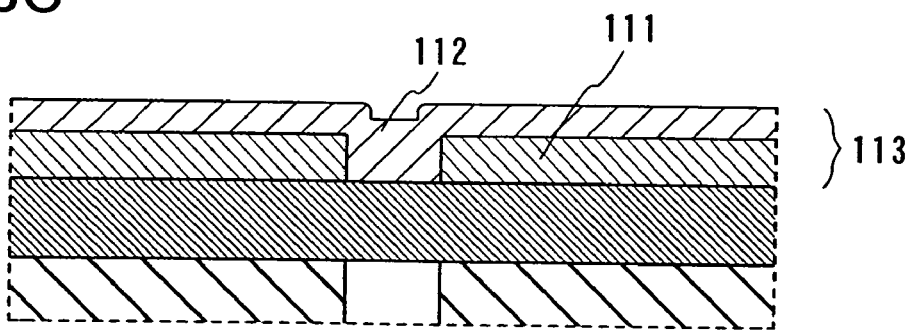

Next, by an epitaxial growth method, a second single crystalline silicon film 112 is formed over the gap 109 between the first single crystalline silicon films formed over the first seed substrate 104, and the first single crystalline silicon films 111 (FIG. 3C).

The epitaxial growth method is a technique in which over a single crystalline substrate, a single crystalline thin film having a crystal axis identical to a crystal axis of the single crystalline substrate is grown. In particular, a case where the substrate and a film obtained by epitaxial growth are formed from the same element, as described in Embodiment Mode 1, is called homoepitaxy. In addition, the epitaxial growth method is classified into solid phase epitaxy, liquid phase epitaxy and vapor phase epitaxy depending on the phase of growth. Vapor phase epitaxy includes physical vapor deposition such as molecular beam epitaxy (MBE), and chemical vapor deposition (CVD). In Embodiment Mode 1, an example is described, in which the second single crystalline silicon film 112 is formed by a chemical vapor disposition method which is one of the vapor phase epitaxial methods.

The chemical vapor deposition method is a method in which a vapor source material is brought to a region in which a crystal is desired to be grown, and the crystal is grown there. In other words, the source material is brought by a carrier gas, over a single crystal serving a seed, and a single crystalline thin film is formed over the seed. In Embodiment Mode 1, the second single crystalline silicon film 112 is formed over the first single crystalline silicon film 111 and the first seed substrate 104 which serve as a seed by a CVD method using $SiH_4$ as a source material. In other words, a portion of the second single crystalline silicon film 112 which is formed over the first single crystalline silicon film 111 is formed using the first single crystalline silicon film 111 as a seed, and a portion of the second single crystalline silicon film 112 which is formed so as to fill the gap 109 between the first single crystalline silicon films is formed using a portion of the first seed substrate 104 overlapping with the gap 109 between the first single crystalline silicon films, as a seed.

If an impurity such as an oxide film (e.g., a silicon oxide film) is formed over the first single crystalline silicon film 111 and the first seed substrate 104 which serve as a seed, formation of the second single crystalline silicon film 112 having a high film quality may be hindered by the impurity, and thus the impurity is preferably removed in advance.

Figure 3D:
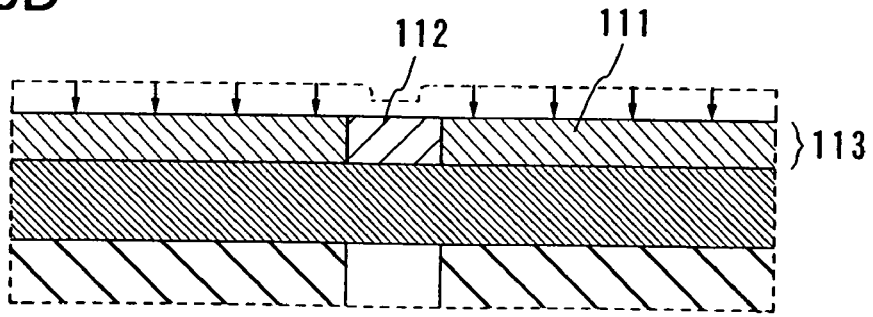

In this case, a film including the first single crystalline silicon film 111 and the second single crystalline silicon film 112 is called a third single crystalline silicon film 113. In the third single crystalline silicon film 113, the second single crystalline silicon film 112 is formed in not only a region overlapping with the first single crystalline silicon film 111 but also a region not overlapping therewith, and thus the surface of the third single crystalline silicon film 113 is uneven as a whole. For this reason, the surface of the third single crystalline silicon film 113 is polished by chemical mechanical polishing (CMP) to be planarized (FIG. 3D).

When the surface of the third single crystalline silicon film 113 is planarized, grinding of the surface may be conducted until the second single crystalline silicon film 112 over the first single crystalline silicon film 111 is completely removed, or the second single crystalline silicon film 112 may be left as long as the planarity of the surface can be obtained. Alternatively, a part of the first single crystalline silicon film 111 may also be polished in some cases.

Through the above steps, the third single crystalline silicon film 113, which is a single crystalline semiconductor film having an area much larger than the size of one silicon wafer size, can be obtained.

Figure 4A:
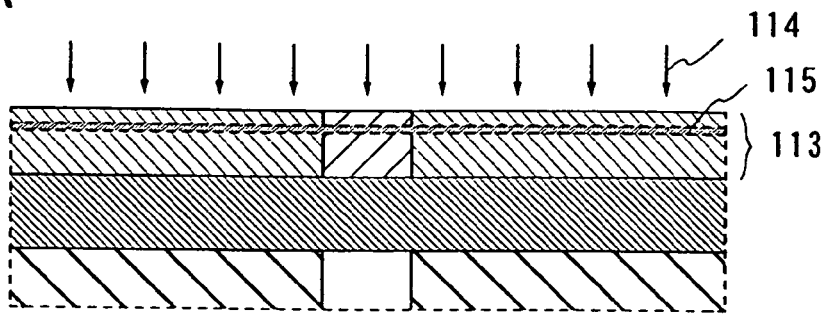
FIGS. 4A to 4D are cross-sectional views illustrating a manufacturing method of an SOI substrate according to an aspect of the present invention.

Next, as illustrated in FIG. 4A, ions 114 accelerated by an electric field are implanted at a predetermined depth (more than 0 to several micrometers) of the third single crystalline silicon film 113 to form a second separation layer 115. The second separation layer 115 can be formed in a similar manner to the above-described first separation layer 107, and thus the description thereof is omitted.

Figure 4B:
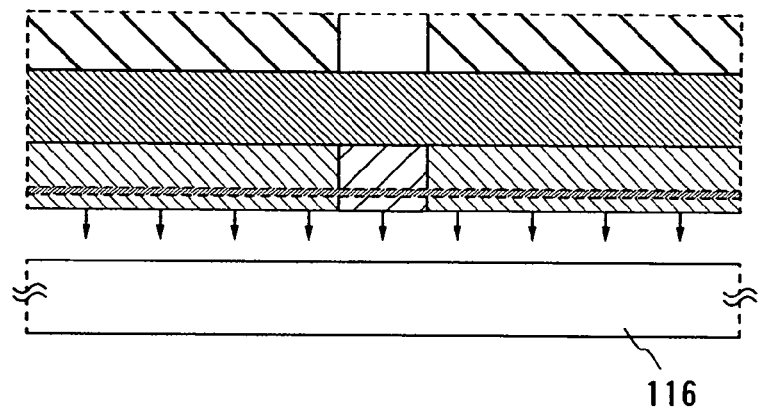

Next, the surface of the third single crystalline silicon film 113 which has been subjected to implantation of the ions 114 is superimposed and bonded onto the a glass substrate 116 as a substrate having an insulating surface (FIG. 4B). Van der Waals forces act on the bonding, and the third single crystalline silicon film 113 and the glass substrate 116 are formed by pressure bonding and thus a firm bonding due to hydrogen bonds can be obtained. Pressurization is conducted in consideration of withstand pressure of the third single crystalline silicon film 113 and the glass substrate 116, such that a perpendicular pressure to the bonding surface is applied. In addition, as the substrate having an insulating surface used at this time, all types of substrates for the electronics industry e.g., glass substrates such as aluminosilicate glass, aluminoborosilicate glass, and bariumborosilicate glass; quartz glass; plastic substrates, and the like can be used.

In Embodiment Mode 1, an example has been described in which the third single crystalline silicon film 113 which is a single crystalline semiconductor film and the glass substrate are directly bonded to each other. Alternatively, a new layer for strengthening the bonding between the third single crystalline silicon film 113 and the glass substrate or an insulating film to serve as a base film of an active layer of a thin film transistor (e.g., a silicon oxide film, a silicon nitride film, or the like) may be formed over the third single crystalline silicon film 113.

Figure 4C:
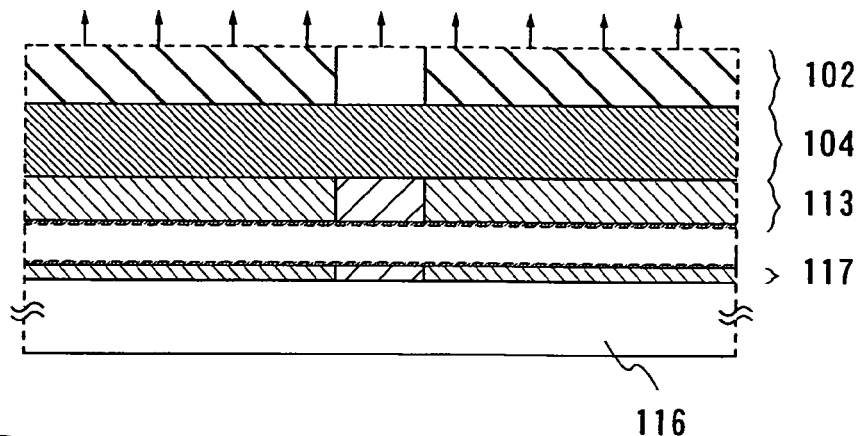
Figure 4D:
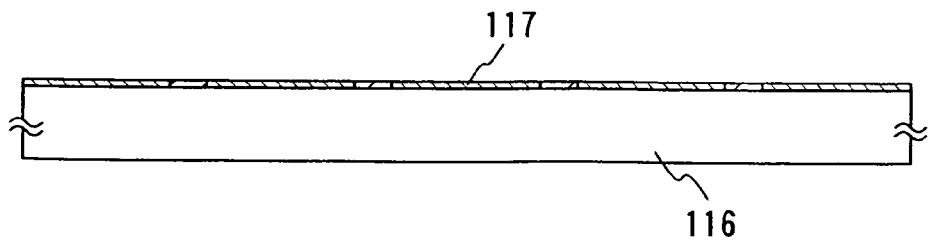

Then, heat treatment is conducted to a state in which the third single crystalline silicon film 113 and the glass substrate 116 are bonded to each other, and the fixing substrate 102 and the first seed substrate 104 are separated from the glass substrate 116, with the second separation layer 115 formed in the third single crystalline silicon film 113 as a cleavage plane (FIG. 4C). The heat treatment is, for example, conducted at 200° C. for 2 hours, and then at 650° C. for 2 hours.

In this manner, a fourth single crystalline silicon film 117 having a thickness of several micrometers or less, which is a part of the third single crystalline silicon film 113, can be formed over the glass substrate 116. In addition, voids, which are a part of the second separation layer 115, exist partially on the surface of the fourth single crystalline silicon film 117, and thus the surface is preferably polished to be planarized by a method such as chemical mechanical polishing (CMP). Further, the resulting fourth single crystalline silicon film 117 can have an area much larger than an SOI film formed from one silicon wafer, and can be formed without any gap in an SOI film formed from plural silicon wafers.

Furthermore, after the surface of a peeled third crystalline silicon film 113 is planarized, a single crystalline silicon film can be formed over another substrate having an insulating surface again by repeating the above-described steps. Thus, the peeled third crystalline silicon film 113 can be reused.

Embodiment Mode 2

In Embodiment Mode 2, a manufacturing method of an SOI substrate according to the present invention is described with reference to FIGS. 5A to 5D and FIGS. 6A to 6D.

Similarly to Embodiment Mode 1, a plurality of silicon wafers 201 with the same thickness are prepared, which are obtained by slicing an ingot of a single crystalline semiconductor. A bonding film 202 is formed over each of the silicon wafers 201. Note that for the bonding film 202, a silicon oxide film having excellent planarity is suitable. In particular, a silicon oxide film formed by a chemical vapor deposition method using an organic silane gas is preferable. Examples of an organic silane gas include gases of silicon-containing compounds such as tetraethoxysilane, tetramethylsilane, tetramethylcyclotetrasiloxane, octamethylcyclotetrasiloxane, hexamethyldisilazane, triethoxysilane, or trisdimethylaminosilane.

Figure 5A:
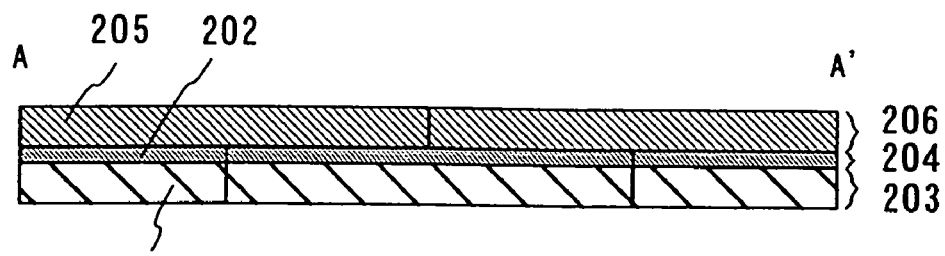
FIGS. 5A to 5D are cross-sectional views illustrating a manufacturing method of an SOI substrate according to an aspect of the present invention.

Next, the plurality of silicon wafers 201 provided with the bonding film 202 are tightly arranged on a plane surface without any space therebetween to form a fixing substrate 203 (FIG. 5A). Also in Embodiment Mode 2, nine silicon wafers 201 having a side of 5 inches are arranged to form the fixing substrate 203. Note that the number of silicon wafers used in formation of the fixing substrate 203 is not limited to nine, and may be increased or decreased as appropriate. In addition, the shape of the silicon wafers constituting the fixing substrate 203 is not limited to a square shape, and may be circular or rectangular. Further, as a material of the fixing substrate 203, a silicon wafer is not a limiting example, and any known material which can fix a first seed substrate to be formed next and can withstand a process temperature of a later step can be used.

Over the fixing substrate 203 constituted of the silicon wafers 201 which are tightly arranged without any space therebetween, a bonding layer 204 constituted of the bonding films 202 formed over the respective silicon wafers 201 is formed.

Then, as in Embodiment Mode 1, sixteen silicon wafers 205 are tightly arranged without any space therebetween over the fixing substrate 203 to form the first seed substrate 206. At this time, the silicon wafer 205 constituting a part of the first seed substrate 206 is arranged such that the center of the silicon wafer 205 is located over the corner (so-called lattice point) of the silicon wafer 201 constituting a part of the fixing substrate 203. In Embodiment Mode 2, since the bonding layer 204 is formed between the fixing substrate 203 and the first seed substrate 206, the fixing substrate 203 and the first seed substrate 206 are firmly bonded to each other. In addition, in order to more firmly bond the fixing substrate 203 and the first seed substrate 206 to each other, heat treatment or pressuring treatment may be conducted. Through the above steps, the fixing substrate 203 and the first seed substrate 206 are bonded, and the bonded substrates can be used as one large-size silicon wafer.

Figure 5B:
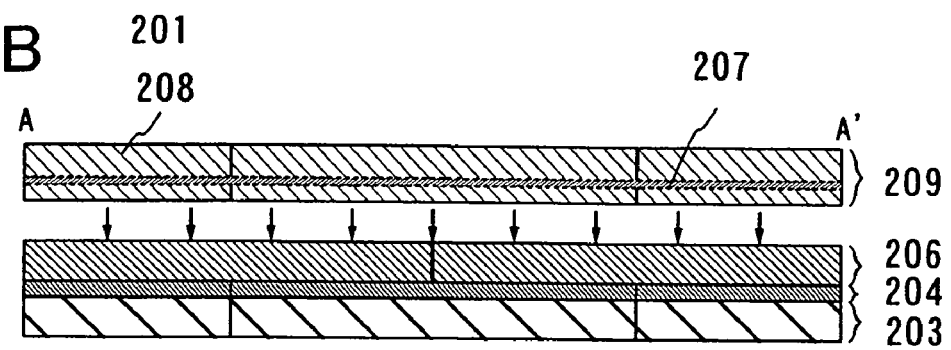

Next, nine new silicon wafers 208 are prepared, in which a first separation layer 207 is formed by implanting ions accelerated by an electric field at a predetermined depth (to several micrometers) as in Embodiment Mode 1. As illustrated in FIG. 5B, nine silicon wafers 208 each including the first separation layer 207 are tightly arranged without any space therebetween over the first seed substrate 206 such that the first seed substrate 206 can be in contact with the surface subjected to ion implantation, thereby forming a second seed substrate 209 (FIG. 5B). In this case, the first seed substrate 206 and the second seed substrate 209 are firmly bonded to each other. Van der Waals forces act on the bonding, and the first seed substrate 206 and the second seed substrate 209 are formed by pressure bonding and thus a firm bonding due to hydrogen bonds can be obtained. Pressurization is conducted in consideration of withstand pressure of the first seed substrate 206 and the second seed substrate 209, such that a perpendicular pressure to the bonding surface is applied. In addition, if an impurity such as an oxide film is attached to the surface of the silicon wafer 208, the impurity may cause reduction of the bonding strength, and thus the impurity is preferably removed before the bonding.

Figure 5C:
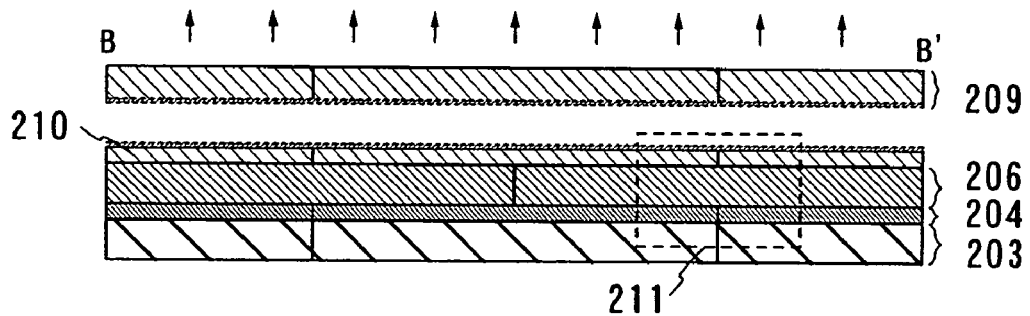

Then, heat treatment is conducted to a state in which the fixing substrate 203, the first seed substrate 206, and the second seed substrate 209 are stacked. As a result, the second seed substrate 209 is separated, with the first separation layer 207 formed in the second seed substrate 209 as a cleavage plane. In this manner, a first single crystalline silicon film 210 having a thickness of several micrometers or less, which is a part of the second seed substrate 209, is formed over the first seed substrate 206 (FIG. 5C). In addition, voids, which are a part of the first separation layer 207, exist partially on the surface of the first single crystalline silicon film 210, and thus the surface is preferably polished to be planarized by chemical mechanical polishing (CMP).

Also in Embodiment Mode 2, similar to Embodiment Mode 1, in the second seed substrate 209 constituted of tightly-arranged silicon wafers, a gap exists somehow between adjacent silicon wafers and thus the first single crystalline silicon film 210 formed over the first seed substrate 206 also has a gap with a neighboring single crystalline silicon film, similarly. Accordingly, also in Embodiment Mode 2, a film is formed over a gap between first single crystalline silicon films formed over the first seed substrate 206 and the first single crystalline silicon films 210 by an epitaxial growth method.

In Embodiment Mode 1, the second single crystalline silicon film is formed by a vapor epitaxial growth method. However, in Embodiment Mode 2, an amorphous silicon film is formed by a solid phase epitaxial growth method, as an example.

The solid phase epitaxial growth method is a method in which an amorphous film is formed over a single crystalline substrate, and heat treatment is conducted, so that the amorphous state is converted to a single crystalline state. This is done because crystallization of the amorphous film proceeds by solid phase reaction using a single crystalline substrate as a seed.

Figure 5D:
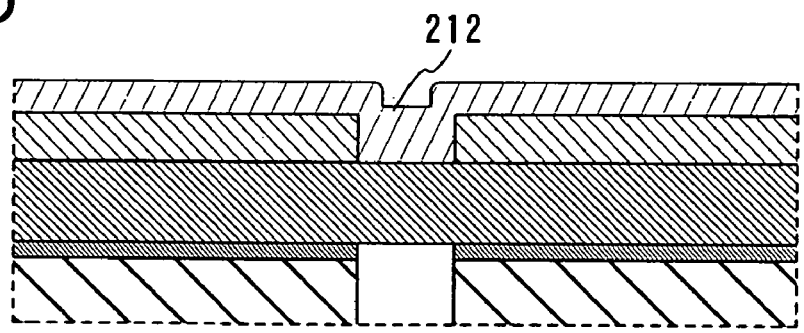

In Embodiment Mode 2, an amorphous silicon film 212 is formed over the first single crystalline silicon film 210 and the first seed substrate 206 which serve as a seed, by a CVD method. In addition, if an impurity such as an oxide film (e.g., a silicon oxide film) is formed at an interface between the amorphous silicon film 212 and the first single crystalline silicon film 210 or an interface between the amorphous silicon film 212 and the first seed substrate 206, the impurity may hinder formation of an excellent epitaxy growth film, and thus the impurity is preferably removed in advance. FIG. 5D is an expansion view in a case where the surface of the first single crystalline silicon film 210 is polished by CMP, and then the amorphous silicon film 212 is formed in a region 211 in FIG. 5C.

Next, the amorphous silicon film 212 formed in contact with the first single crystalline silicon film 210 and the first seed substrate 206 is subjected to heat treatment. By the heat treatment, the first single crystalline silicon film 210 and the first seed substrate 206 which serve as a seed perform a solid-phase reaction with the amorphous silicon film 212, and the amorphous silicon film 212 is converted from the amorphous state to a single crystalline state, so that a second single crystalline silicon film 213 is formed.

Figure 6A:
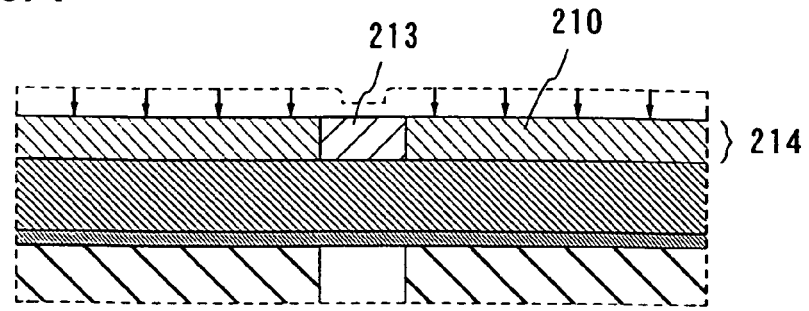
FIGS. 6A to 6D are cross-sectional views illustrating a manufacturing method of an SOI substrate according to an aspect of the present invention.

In this case, a film including the first single crystalline silicon film 210 and the second single crystalline silicon film 213 is referred to as a third single crystalline silicon film 214. In the third single crystalline silicon film 214, the second single crystalline silicon film 213 is not only a region overlapping with the first single crystalline silicon film 210 but also a region not overlapping therewith, and thus the surface of the third single crystalline silicon film 214 is uneven as a whole. For this reason, the surface of the third single crystalline silicon film 214 is polished by chemical mechanical polishing (CMP) to be planarized (FIG. 6A).

When the surface of the third single crystalline silicon film 214 is planarized, polishing the surface may be conducted until the second single crystalline silicon film 213 over the first single crystalline silicon film 210 is completely removed, or the second single crystalline silicon film 213 may be left as long as the planarity of the surface can be obtained. Alternatively, a part of the first single crystalline silicon film 210 may also be polished in some cases.

Through the above steps, the third single crystalline silicon film 214 which is a single crystalline semiconductor film having an area much larger than the size of one silicon wafer size can be obtained.

In addition, over the third single crystalline silicon film 214, a bonding layer for increasing a bonding strength with a glass substrate to be bonded later, or an insulating film such as a silicon oxide film or a silicon nitride film to serve as a base film for an active layer of a thin film transistor may be formed. In formation of the bonding layer, the method by which the bonding film 202 is formed described in Embodiment Mode 2 can be used.

Figure 6B:
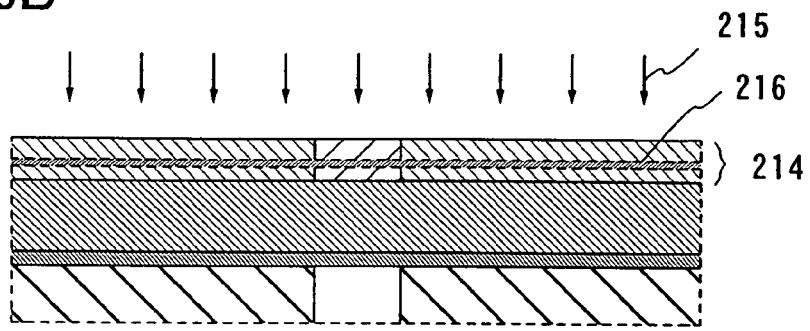

Next, as illustrated in FIG. 6B, ions 215 accelerated by an electric field are implanted at a predetermined depth (more than 0 to several micrometers) of the third single crystalline silicon film 214 to form a second separation layer 216. The second separation layer 216 can be formed in a similar manner to the first separation layer 107 described in Embodiment Mode 1, and thus the description thereof is omitted.

Figure 6C:
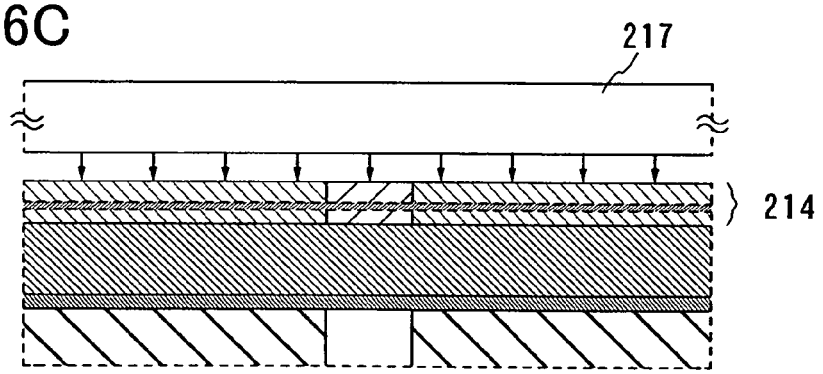

Next, a glass substrate 116 as a substrate having an insulating surface is superimposed and bonded to the surface of the third single crystalline silicon film 214 which has been subjected to implantation of the ions 215 (FIG. 6C). Van der Waals forces act on the bonding, and the third single crystalline silicon film 214 and the glass substrate 217 are formed by pressure bonding and thus a firm bonding due to hydrogen bonds can be obtained. Pressurization is conducted in consideration of withstand pressure of the third single crystalline silicon film 214 and the glass substrate 217, such that a perpendicular pressure to the bonding surface is applied. In addition, as the substrate having an insulating surface used at this time, all types of substrates for the electronics industry, e.g., glass substrates such as aluminosilicate glass, aluminoborosilicate glass, and bariumborosilicate glass; quartz glass; plastic substrates, and the like can be used.

In Embodiment Mode 2, an example has been described in which the third single crystalline silicon film 214 which is a single crystalline semiconductor film, and the glass substrate are directly bonded to each other. Alternatively, a new layer for strengthening the bonding with the glass substrate or an insulating film (e.g., a silicon oxide film, a silicon nitride film, or the like) to serve as a base film of an active layer of a thin film transistor may be formed over the third single crystalline silicon film 214.

Figure 6D:
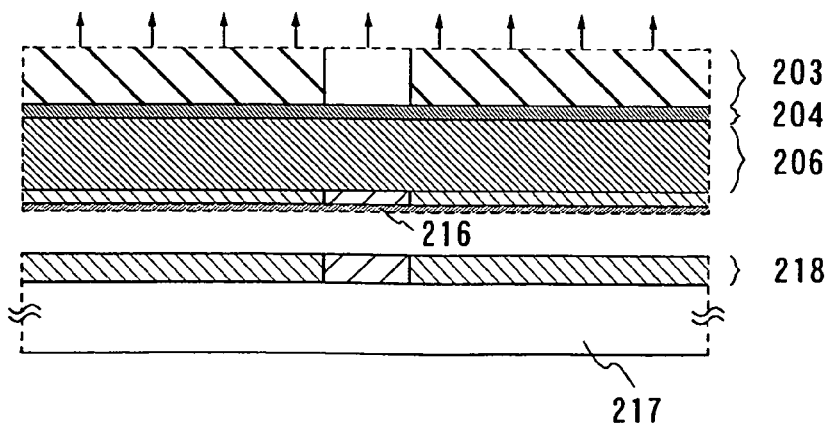

Then, heat treatment is conducted to a state in which the third single crystalline silicon film 214 and the glass substrate 217 are bonded to each other, and the fixing substrate 203 and the first seed substrate 206 are separated from the glass substrate 217, with the second separation layer 216 formed in the third single crystalline silicon film 214 as a cleavage plane (FIG. 6D). The heat treatment is, for example, conducted at 200° C. for 2 hours, and then at 650° C. for 2 hours.

In this manner, a fourth single crystalline silicon film 218 having a thickness of several micrometers or less, which is a part of the third single crystalline silicon film 214, can be formed over the glass substrate 217. In addition, voids, which are a part of the second separation layer 216, exist partially on the surface of the fourth single crystalline silicon film 218, and thus the surface is preferably polished to be planarized by a method such as chemical mechanical polishing (CMP). Further, the resulting fourth single crystalline silicon film 218 can have an area much larger than an SOI film formed from one silicon wafer, and can be formed without any gap in an SOI film formed from plural silicon wafers.

Furthermore, after the surface of a peeled third crystalline silicon film 214 is planarized, a single crystalline silicon film can be formed over another substrate having an insulating surface again by repeating the above-described steps. Thus, the peeled third crystalline silicon film 214 can be reused.

Embodiment Mode 3

In Embodiment Mode 3, a manufacturing method of a semiconductor device according to the present invention, using an SOI substrate described in Embodiment Mode 1 or 2, is described with reference to FIGS. 7A to 7D, FIGS. 8A to 8D, and FIG. 9.

First, a single crystalline semiconductor film formed over a substrate 701 by the method described in Embodiment Mode 1 or Embodiment Mode 2 is etched, so that element separation is conducted in accordance with arrangement of semiconductor elements, and semiconductor films 702 are formed. Note that the substrate 701 is a substrate having an insulating surface or an insulating substrate, and all types of substrates for the electronics industry, e.g., glass substrates such as aluminosilicate glass, aluminoborosilicate glass, and bariumborosilicate glass; quartz glass; plastic substrates, and the like can be used.

In addition, although not illustrated here, an insulating film serving as a base film may be formed over the substrate 701. This insulating film is effective for preventing an impurity such as alkali metal from diffusing from the substrate 701 into the semiconductor film 702 to be formed over the substrate 701 later and contaminating it.

The insulating film is formed using an insulating material such as silicon oxide, silicon nitride, or silicon containing oxygen and nitrogen (silicon oxynitride) by a CVD method or a sputtering method. For example, in a case of a two-layer insulating film, a silicon nitride film may be formed as a first layer and a silicon oxynitride film may be formed as a second layer. Alternatively, a silicon nitride film may be formed as a first layer and a silicon oxide film may be formed as a second layer.

Next, a gate insulating film 703 is formed over the semiconductor films 702. The gate insulating film 703 is formed to a thickness of from 5 nm to 50 nm, inclusive. The gate insulating film 703 is preferably formed of a silicon oxide film or a silicon oxynitride film.

In this case, the gate insulating film 703 is formed by a vapor deposition method. In the case of forming the gate insulating film 703 with high quality at a temperature of 450° C. or lower, a plasma CVD method is preferably used. In particular, it is preferable to use a microwave plasma CVD method with an electron density approximately from $1 \times 10^{11}$ cm$^{-3}$ to $1 \times 10^{13}$ cm$^{-3}$ and an electron temperature approximately from 0.2 eV to 2.0 eV (preferably, from 0.5 eV to 1.5 eV). When plasma with high electron density, a low electron temperature, and low kinetic energy of active species is used, a film with has few plasma damages and few defects can be formed.

After forming the gate insulating film 703, gate electrodes 704 and 705 are formed. As the material used to form the gate electrodes 704 and 705, for example, a metal element such as Ag, Au, Cu, Ni, Pt, Pd, Ir, Rh, W, Al, Ta, Mo, Cd, Zn, Fe, Ti, Si, Ge, Zr, Ba, or Nd, an alloy material containing the metal element as its main component, a compound material containing the metal element such as metal nitride, or a material using a plurality thereof can be used.

Then, a resist 706 is formed and an n-type impurity 707 is implanted, and thereby first impurity regions 708 are formed (FIG. 7B). Further, after the resist 706 is removed, a resist 709 is formed and a p-type impurity 710 is implanted, and thereby second impurity regions 711 are formed (see FIG. 7C).

The first impurity regions 708 formed here function as a source region and a drain region of an n-channel transistor. The first impurity regions 708 are formed by adding phosphorus or arsenic, which is the n-type impurity 707, at a peak concentration of approximately from $1 \times 10^{18}$ atoms/cm$^3$ to $1 \times 10^{20}$ atoms/cm$^3$. Further the second impurity regions 711 function as a source region and a drain region of a p-channel transistor. The second impurity regions 711 are formed by adding boron, aluminum, gallium or the like, which is the p-type impurity 710, at a peak concentration of approximately from $1 \times 10^{18}$ atoms/cm$^3$ to $1 \times 10^{20}$ atoms/cm$^3$.

Figure 8A:
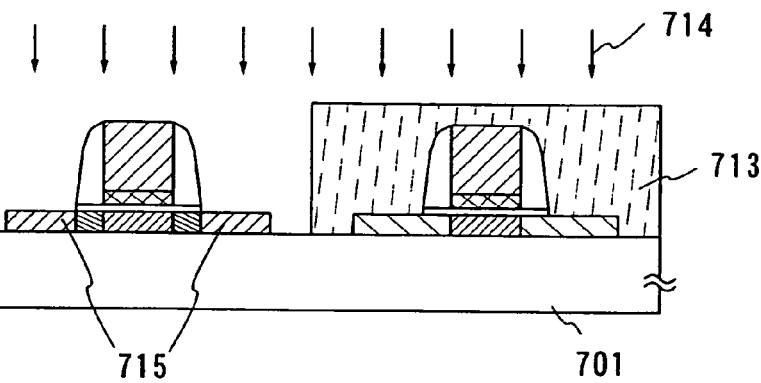
FIGS. 8A to 8D are cross-sectional views illustrating a manufacturing method of a semiconductor device according to an aspect of the present invention.
Figure 8B:
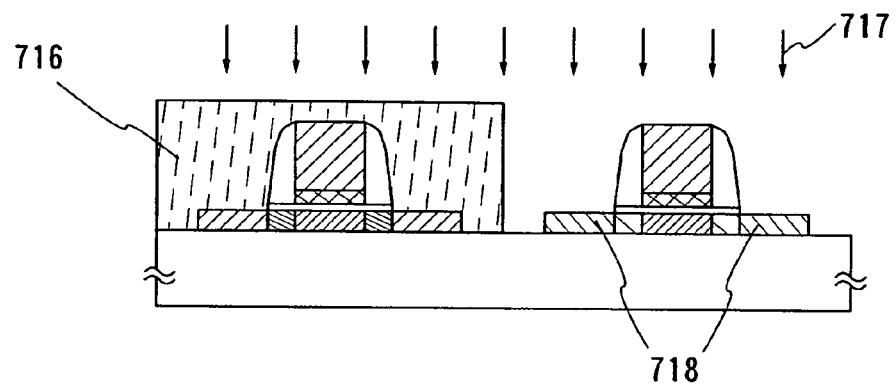

Then, after removing the resist 709, a sidewall insulating layer 712 is formed (FIG. 7D). A resist 713 is formed and an n-type impurity 714 is implanted, and thereby third impurity regions 715 are formed (FIG. 8A). The third impurity regions 715 are formed by adding phosphorus or arsenic, which is the n-type impurity 714, at a peak concentration of approximately from $1 \times 10^{19}$ atoms/cm$^3$ to $1 \times 10^{20}$ atoms/cm$^3$. After the resist 713 is removed, a resist 716 is formed and a p-type impurity 717 is implanted, and thereby fourth impurity regions 718 are formed (FIG. 8B). The fourth impurity regions 718 can be formed by adding boron, aluminum, gallium or the like, which is the p-type impurity 717, at a peak concentration of approximately from $1 \times 10^{19}$ atoms/cm$^3$ to $5 \times 10^{21}$ atoms/cm$^3$.

Figure 8C:
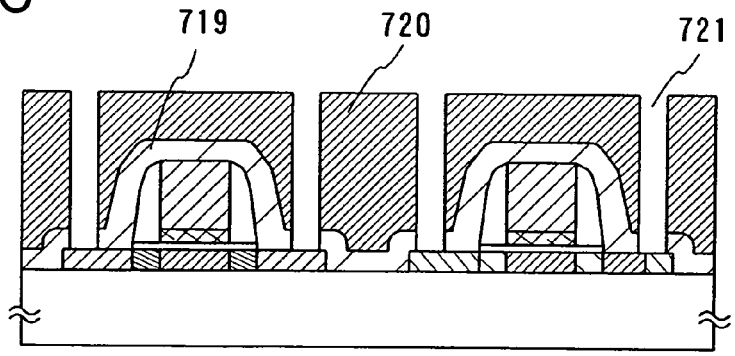

After the resist 716 is removed, a protective film 719 is formed. As the protective film 719, a silicon nitride film or a silicon nitride oxide film can be used. An interlayer insulating film 720 is formed over the protective film 719. As the interlayer insulating film 720, in addition to an inorganic insulating film such as silicon oxide, silicon nitride, silicon oxynitride, or silicon nitride oxide, a boron phosphorus silicon glass (BPSG) film, or an organic resin film typified by polyimide can be used. Furthermore, contact holes 721 are formed in the interlayer insulating film 720 and in the protective film 719 (FIG. 8C).

Figure 8D:
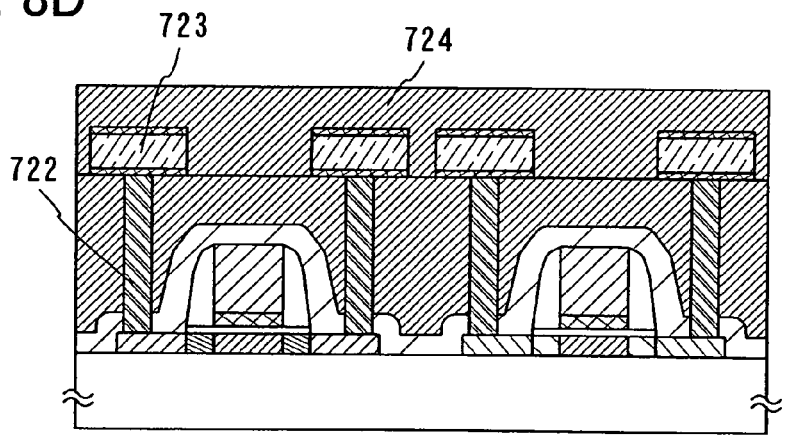

Then, formation of a wiring is described. As illustrated in FIG. 8D, in the contact holes 721, contact plugs 722 are formed. As the contact plugs 722, tungsten silicide is formed by a chemical vapor deposition method using a WF$_6$ gas and a SiH$_4$ gas to fill the contact holes 721. Alternatively, tungsten may be formed by hydrogen reduction of WF$_6$ to fill the contact holes 721. After that, a wiring 723 is formed to correspond to the contact plugs 722. The wiring 723 is formed of aluminum or an aluminum alloy, and an upper layer and a lower layer thereof are formed using metal layers of molybdenum, chromium, titanium, or the like as barrier metal. Furthermore, an interlayer insulating layer 724 is formed over the barrier metal. The wiring may be provided as appropriate, and a multilayer wiring may be formed by further forming a wiring layer over the wiring. In the case of forming the multilayer wiring, a damascene process may be employed.

Figure 9:
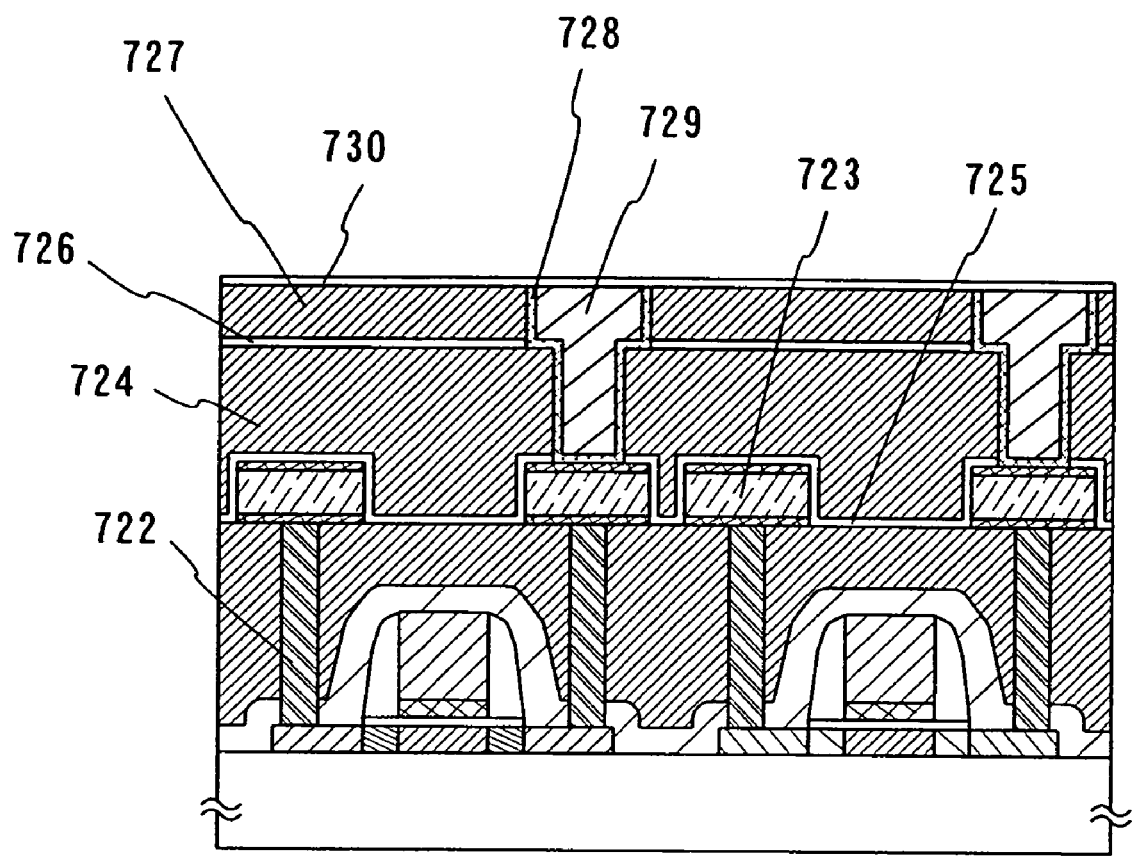
FIG. 9 is a cross-sectional view illustrating a manufacturing method of a semiconductor device according to an aspect of the present invention.

FIG. 9 illustrates a mode of forming a multilayer wiring by further forming an upper wiring over the interlayer insulating layer 724. A passivation film 725 is formed of a silicon nitride film over the wiring 723, and the interlayer insulating layer 724 is provided. Further, a passivation film 726 and an insulating layer 727 are formed over the interlayer insulating layer 724. The wiring thus formed as an upper layer can be formed by, for example, a damascene method or a dual-damascene method. A barrier metal 728 is formed of tantalum or tantalum nitride. A copper wiring 729 is formed by a plating method and embedded in the insulating layer 727 by a chemical mechanical polishing (CMP) method. A passivation film 730 is formed of silicon nitride thereover. The number of layers stacked as wirings is optional and may be selected as appropriate.

Accordingly, a thin film transistor can be manufactured using an SOI substrate having a large-area single crystalline semiconductor film.

Embodiment Mode 3 can be combined with any of the structures described in Embodiment Modes 1 and 2, as appropriate.

The thin film transistor according to Embodiment Mode 3 is formed using a large-area single crystalline semiconductor film formed by the method described in Embodiment Mode 1 or 2, which is a semiconductor film having constant crystal orientation (a third single crystalline semiconductor film), and thus the thin film transistor can have uniform and high performance. In other words, it is possible to suppress non-uniformity of values of important transistor characteristics, such as a threshold voltage and mobility, and to achieve high performance such as high mobility.

Embodiment Mode 4

Figure 10:
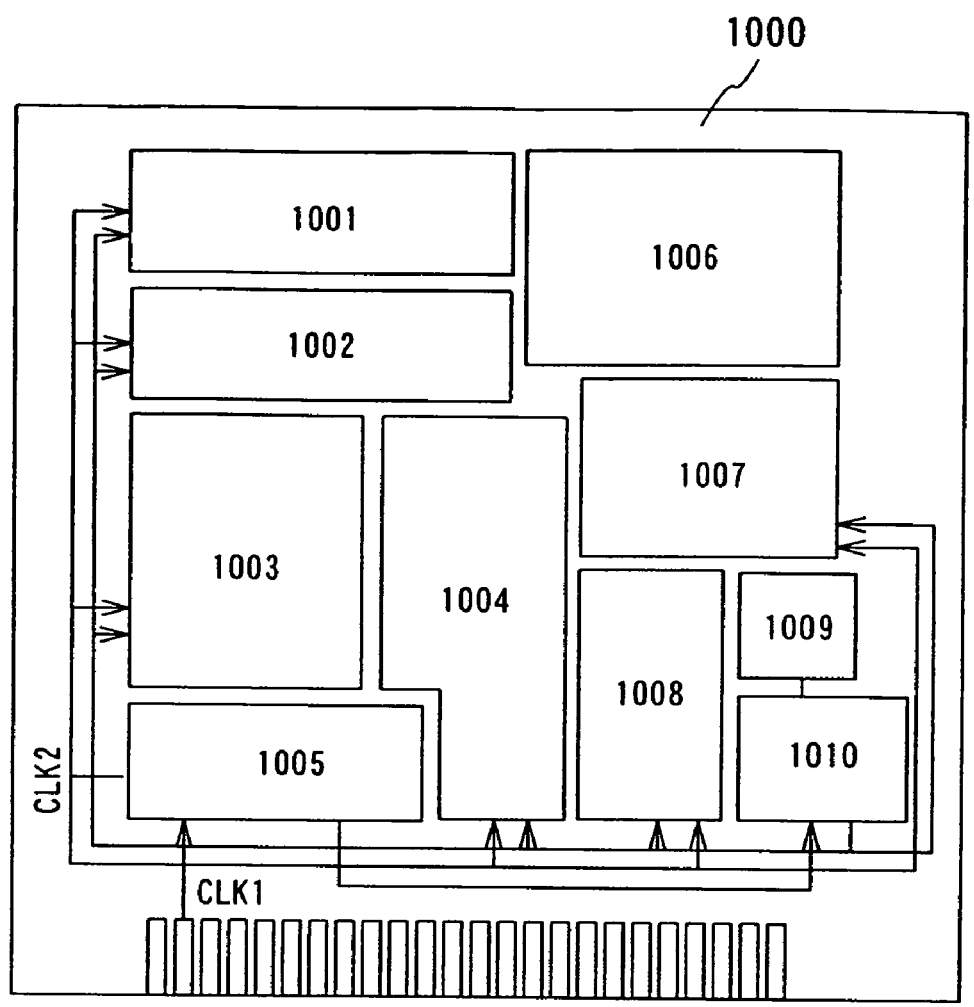
FIG. 10 is a block diagram of a structure of a microprocessor according to an aspect of the present invention.

In Embodiment Mode 4, as an example of a semiconductor device formed using an SOI substrate of the present invention as described in Embodiment Mode 1 or 2, a microprocessor is described with reference to FIG. 10.

A microprocessor 1000 includes an arithmetic logic unit (also referred to as ALU) 1001, an ALU controller 1002, an instruction decoder 1003, an interrupt controller 1004, a timing controller 1005, a register 1006, a register controller 1007, a bus interface (Bus I/F) 1008, a read only memory (ROM) 1009, and a memory interface (ROM I/F) 1010.

An instruction inputted to the microprocessor 1000 through the bus interface 1008 is inputted to the instruction decoder 1003 and decoded. Then, the instruction is inputted to the ALU controller 1002, the interrupt controller 1004, the register controller 1007, and the timing controller 1005. The ALU controller 1002, the interrupt controller 1004, the register controller 1007, and the timing controller 1005 perform various controls based on the decoded instruction.

Specifically, the ALU controller 1002 generates a signal for controlling the operation of the arithmetic logic unit 1001. The interrupt controller 1004 determines an interrupt request from an external input/output device or a peripheral circuit and processes the request based on its priority, a mask state or the like, while a program of the microprocessor 1000 is executed. The register controller 1007 generates an address of the register 1006, and reads/writes data from/to the register 1006 in accordance with the state of the microprocessor 1000. The timing controller 1005 generates signals for controlling timing of driving of the arithmetic logic unit 1001, the ALU controller 1002, the instruction decoder 1003, the interrupt controller 1004, and the register controller 1007. For example, the timing controller 1005 is provided with an internal clock generator for generating an internal clock signal CLK2 based on a reference clock signal CLK1, and supplies the clock signal CLK2 to the above-mentioned circuits. It is to be noted that the microprocessor 1000 illustrated in FIG. 10 is just an example of the simplified structure, and practical microprocessors have a wide variety of structures depending on usage.

Embodiment Mode 4 can be combined with any of the structures described in Embodiment Modes 1 to 3, as appropriate.

The microprocessor 1000 according to Embodiment Mode 4 is formed using a large-area single crystalline semiconductor film formed by the method described in Embodiment Mode 1 or 2, and an integrated circuit is formed using a semiconductor film having constant crystal orientation (a third single crystalline semiconductor film), and thus the thin film transistor can achieve low power consumption as well as high processing speed.

Embodiment Mode 5

Figure 11:
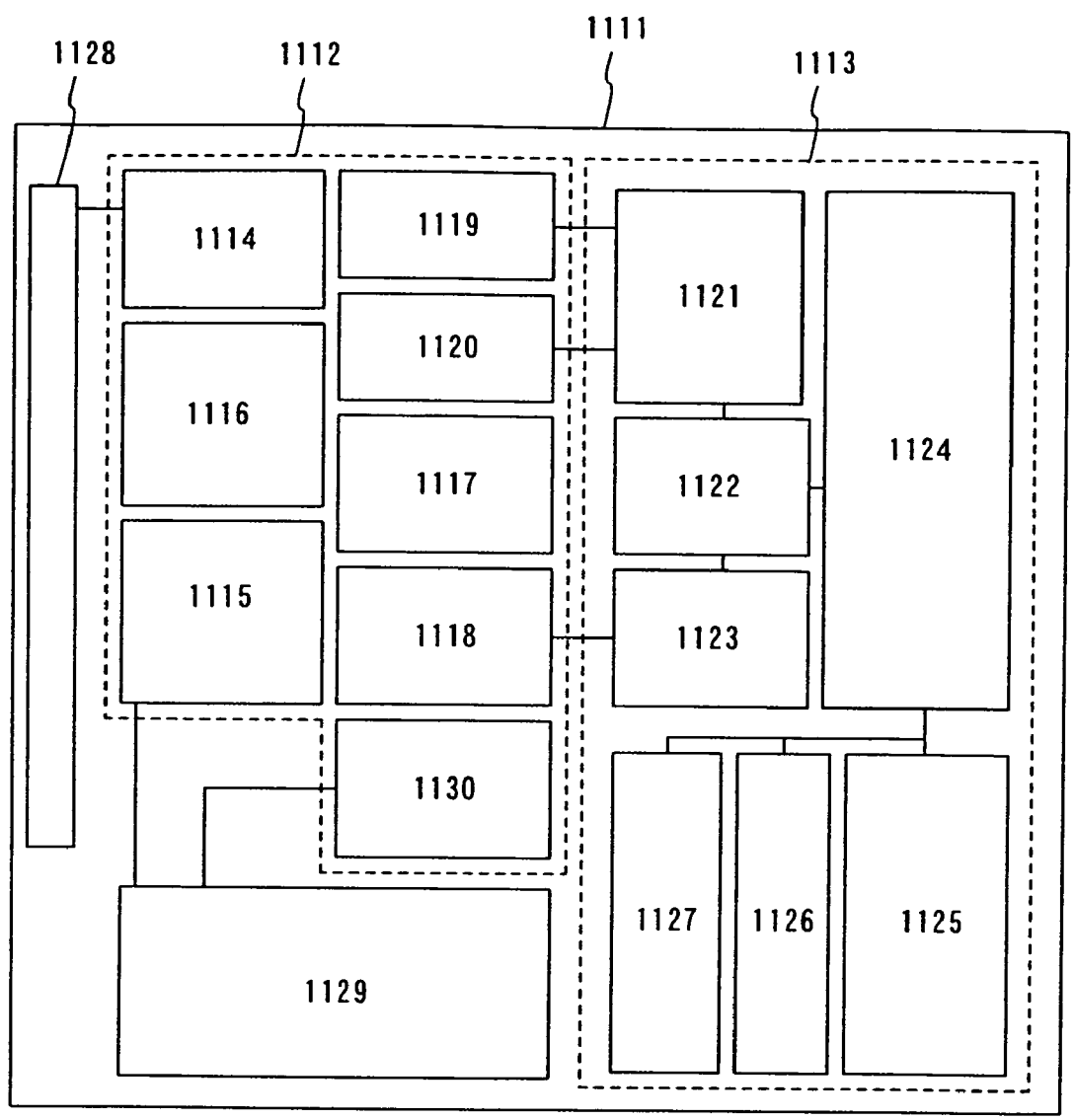
FIG. 11 is a block diagram of a structure of a RFCPU according to an aspect of the present invention.

In Embodiment Mode 5, as an example of a semiconductor device formed using an SOI substrate according to the present invention as described in Embodiment Mode 1 or 2, a semiconductor device having an arithmetic function, which is capable of transmitting and receiving data without contact, is described FIG. 11 is an example of a computer (hereinafter referred to as an RFCPU) which operates by transmitting and receiving signal to/from an external device by wireless communication. An RFCPU 1111 has an analog circuit portion 1112 and a digital circuit portion 1113. The analog circuit portion 1112 includes a resonant circuit 1114 having a resonant capacitor, a rectifier circuit 1115, a constant voltage circuit 1116, a reset circuit 1117, an oscillator circuit 1118, a demodulation circuit 1119, a modulation circuit 1120, and a power supply control circuit 1130. The digital circuit portion 1113 includes an RF interface 1121, a control register 1122, a clock controller 1123, a CPU interface 1124, a central processing unit (CPU) 1125, a random access memory (RAM) 1126, and a read only memory (ROM) 1127.

The operation of the RFCPU 1111 having such a structure is roughly described below. A signal received at an antenna 1128 causes induced electromotive force at the resonant circuit 1114. The induced electromotive force is stored in a capacitor portion 1129 via the rectifier circuit 1115. The capacitor portion 1129 is preferably formed using a capacitor such as a ceramic capacitor or an electric double layer capacitor. The capacitor portion 1129 may be formed over the same substrate as the RFCPU 1111 or may be attached as another component to a substrate having an insulating surface that partially constitutes the RFCPU 1111.

The reset circuit 1117 generates a signal that resets the digital circuit portion 1113 to be initialized. For example, the reset circuit 1117 generates, as a reset signal, a signal that rises with delay after increase in the power supply voltage. The oscillation circuit 1118 changes the frequency and the duty ratio of a clock signal in accordance with a control signal generated by the constant voltage circuit 1116. The demodulation circuit 1119 including a low pass filter, for example, binarizes changes in amplitude of reception signals of an amplitude shift keying (ASK) system. The modulation circuit 1120 changes the amplitude of transmission signals of an amplitude shift keying (ASK) system to be transmitted. The modulation circuit 1120 changes the resonance point of the resonance circuit 1114, thereby changing the amplitude of communication signals. The clock controller 1123 generates a control signal for changing the frequency and the duty ratio of the clock signal in accordance with power supply voltage or current consumption in the central processing unit 1125. The power supply voltage is monitored by the power supply control circuit 1130.

A signal that is inputted to the RFCPU 1111 from the antenna 1128 is demodulated by the demodulation circuit 1119, and then divided into a control command, data, and the like by the RF interface 1121. The control command is stored in the control register 1122. The control command includes, reading of data stored in the read only memory 1127, writing of data to the random access memory 1126, an arithmetic instruction to the central processing unit 1125, and the like. The central processing unit 1125 accesses the read only memory 1127, the random access memory 1126, and the control register 1122 via the CPU interface 1124. The CPU interface 1124 has a function of generating an access signal for any one of the read only memory 1127, the random access memory 1126, and the control register 1122 based on an address requested by the central processing unit 1125.

As an arithmetic method of the central processing unit 1125, a method may be employed in which the read only memory 1127 stores an OS (operating system) and reading program is executed at the time of starting operation. Alternatively, a method may be employed in which an arithmetic circuit is formed with a dedicated circuit and an arithmetic process is conducted using hardware. In a method in which both hardware and software are used, a method can be used in which a part of process is conducted in a dedicated arithmetic circuit and the other part of the arithmetic process is conducted by the central processing unit 1125 using a program.

Embodiment Mode 5 can be combined with any of the structures described in Embodiment Modes 1 to 4, as appropriate.

The RFCPU according to Embodiment Mode 5 is formed using a large-area single crystalline semiconductor film formed by the method described in Embodiment Mode 1 or 2, and an integrated circuit is formed using a semiconductor film having constant crystal orientation (a third single crystalline semiconductor film), and thus the RFCPU can achieve low power consumption as well as high processing speed. This makes it possible to ensure the operation for a long period of time even when the capacitor portion 1129 which supplies power is downsized. Although FIG. 11 shows the mode of the RFCPU, a device such as an IC tag can be applied, as long as it has a communication function, an arithmetic processing function, and a memory function.

Embodiment Mode 6

In Embodiment Mode 6, a structure where a large-size glass substrate is used as a substrate having an insulating surface used for an SOI substrate of the present invention, and a liquid crystal display device and a light-emitting device as an example of a display device formed using the SOI substrate are described.

Figure 12:
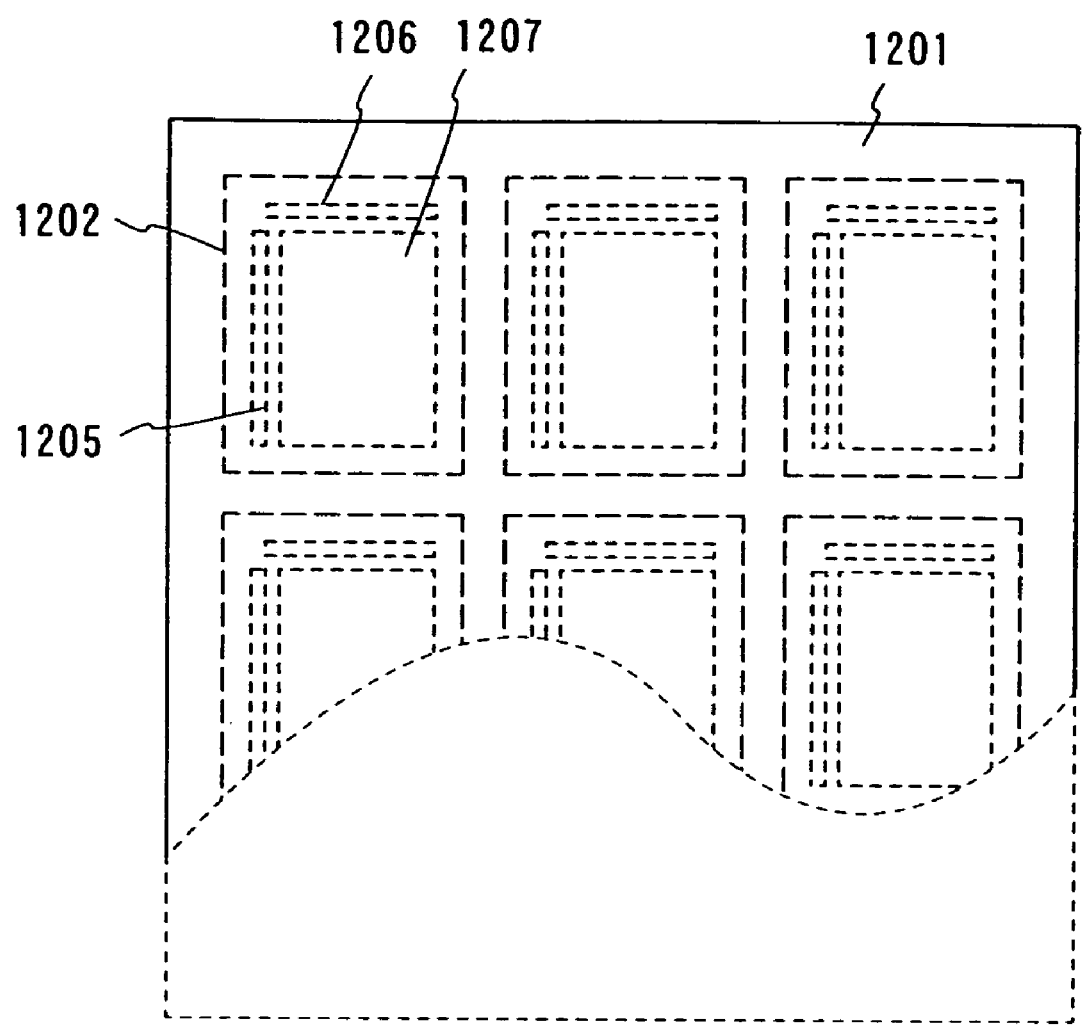
FIG. 12 illustrates a mode in which a single crystalline semiconductor film is bonded to a large substrate according to an aspect of the present invention.

A substrate 1201 illustrated in FIG. 12 is a large-size glass substrate, which is called a mother glass in manufacture of a display panel, and a plurality of display panels 1202 are formed over the substrate 1201. In other words, a large-area single crystalline semiconductor film formed according to the present invention is not limited to use in forming a semiconductor device having a large display portion, and can be used for manufacturing multiple such display panels. In addition, multiple display panels 1202 formed over the mother glass are each taken out in according to each display panel. In each of these display panels 1202, a scan line driver circuit region 1205, a signal line driver circuit region 1206, and a pixel formation region 1207 are formed.

Figure 13A:
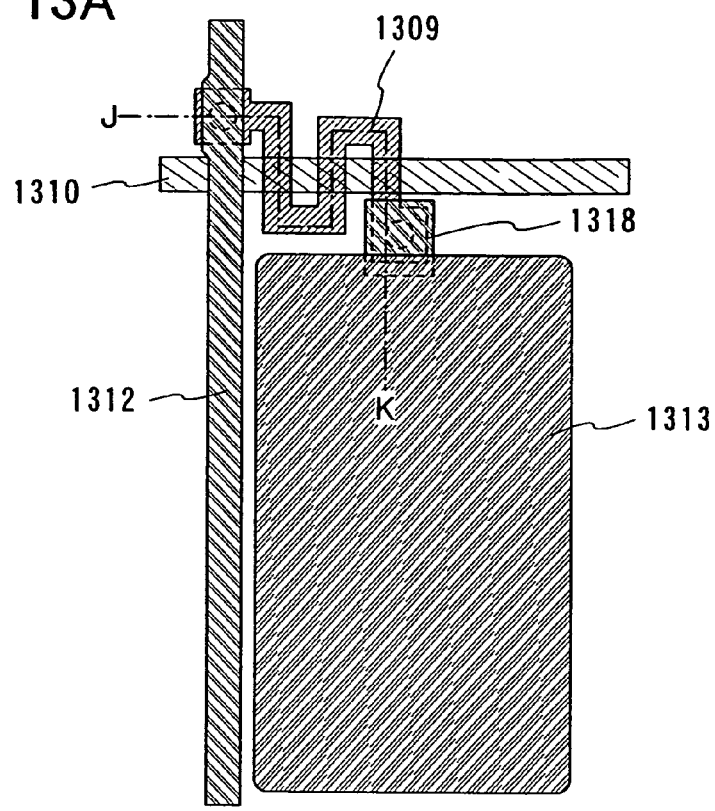
FIGS. 13A and 13B illustrate an example of a liquid crystal display device according to an aspect of the present invention.
Figure 13B:
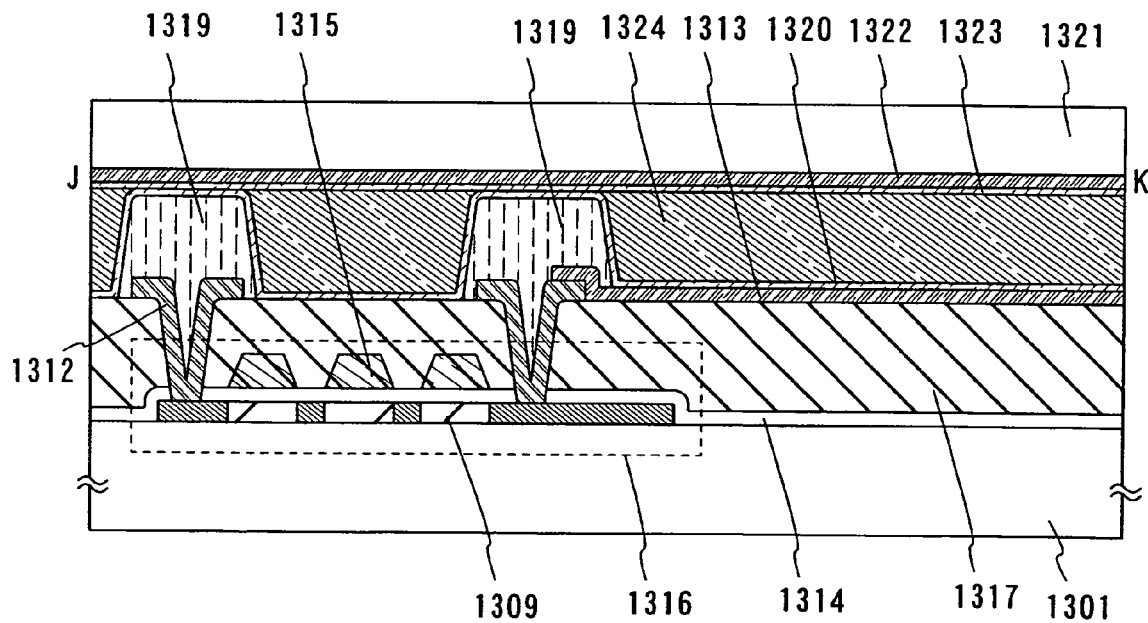

Next, a liquid crystal display device will be described with reference to FIGS. 13A and 13B. FIG. 13A is a plane view of a pixel of the liquid crystal display device, in which a scan line 1310 intersects with a semiconductor film 1309 obtained by element isolation of a large-area single crystalline semiconductor film and a signal line 1312 and a pixel electrode 1313 are connected to the semiconductor film 1309. FIG. 13B is a cross sectional view taken along the line J-K in FIG. 13A.

In FIG. 13B, over the substrate 1301 is a portion where the semiconductor film 1309, a gate insulating film 1314, and a gate electrode 1315 are stacked, and a pixel transistor 1316 is formed to include such a region.

Further, the signal line 1312, the pixel electrode 1313, and an electrode 1318 are provided over an interlayer insulating film 1317. Columnar spacers 1319 are formed over the interlayer insulating film 1317, and an orientation film 1320 is formed to cover the signal line 1312, the pixel electrode 1313, the electrode 1318, and the columnar spacers 1319. A counter substrate 1321 is provided with a counter electrode 1322 and an orientation film 1323 which covers the counter electrode. The columnar spacers 1319 are formed to keep gaps between the substrate 1301 and the counter substrate 1321. A liquid crystal layer 1324 is formed in spaces formed by the columnar spacers 1319. At portions where the semiconductor film 1309 is connected to the signal line 1312 and the electrode 1318, steps are generated in the interlayer insulating film 1317 by formation of the contact holes. The columnar spacers 1319 are provided so as to fill the steps. Accordingly, disorder in the orientation of the liquid crystal layer 1324 due to the steps can be prevented.

Figure 14A:
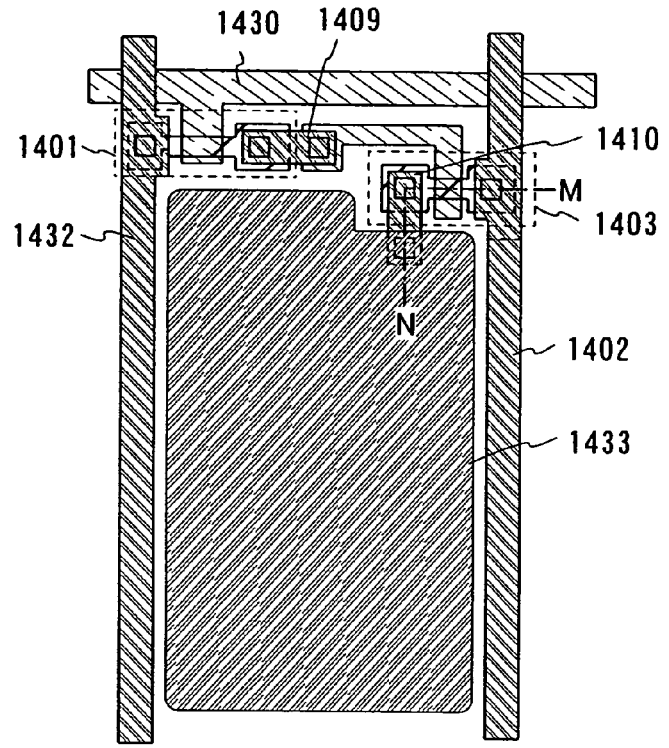
FIGS. 14A and 14B illustrate an example of a light-emitting device according to an aspect of the present invention.
Figure 14B:
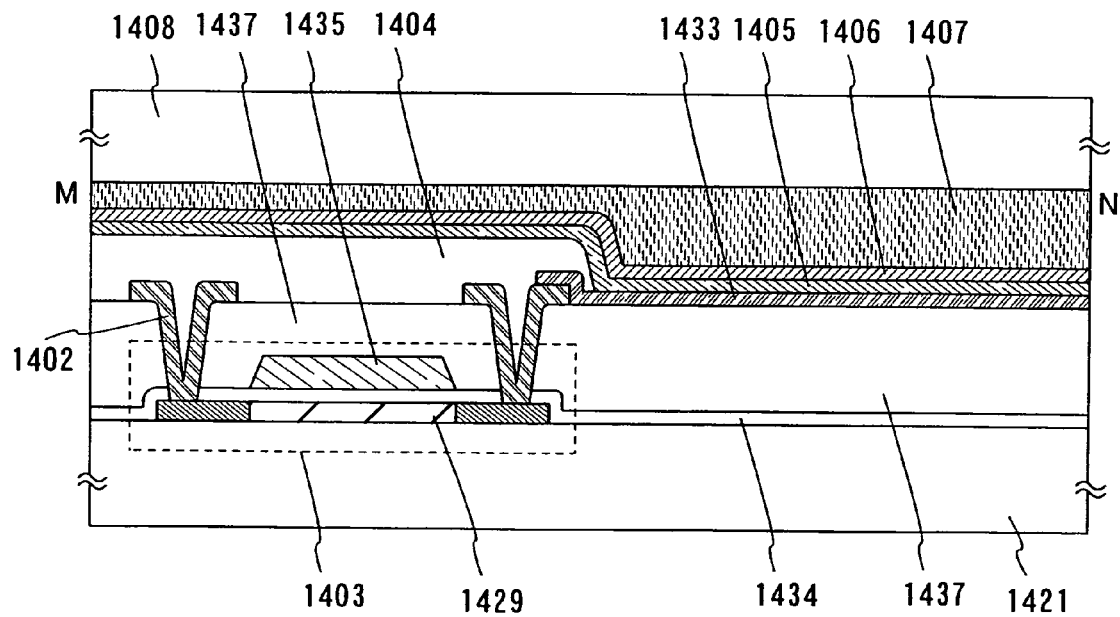

Next, a light-emitting device will be described with reference to FIGS. 14A and 14B. FIG. 14A is a plane view of a pixel of the light-emitting device and includes a selection transistor 1401 which connects to a signal line 1432 and a display control transistor 1403 which connects to a current supply line 1402. This light-emitting device has a structure in which each pixel of the light-emitting device is provided with a light-emitting element that has a layer (EL layer) formed to contain an electroluminescent material between a pair of electrodes. One electrode of the light emitting element is a pixel electrode 1433, which is connected to the display control transistor 1403. FIG. 14B is a cross-sectional view showing a main portion of such a pixel.

In FIG. 14B, a semiconductor film 1429, a gate insulating film 1434, and a gate electrode 1435 are stacked and formed over the substrate 1421. The selection transistor 1401 and the display control transistor 1403 are formed to have such a portion.

Further, a interlayer insulating film 1437 is formed to cover the gate electrode 1435 of the display control transistor 1403. The signal line 1432, the current supply line 1402, electrodes 1409 and 1410, and the like are formed over the interlayer insulating film 1437. Furthermore, the pixel electrode 1433 which is electrically connected to the electrode 1410 is formed. The periphery of the pixel electrode 1433 is surrounded by a partition layer 1404 having an insulating property. An EL layer 1405 is formed over the pixel electrode 1433. A counter electrode 1406 is formed over the EL layer 1405. A pixel portion is filled with a filling resin 1407, and a counter substrate 1408 is provided as a reinforcing plate.

The display device (liquid crystal display device or light-emitting display device) according to Embodiment Mode 6 has a display screen, in which pixels illustrated in FIGS. 13A and 13B or FIGS. 14A and 14B are arranged in matrix. In this case, a channel region of a thin film transistor in each pixel is formed using a large-area single crystalline semiconductor film formed by the method described in Embodiment Mode 1 or 2, which is a single crystalline semiconductor film having constant crystal orientation (a third single crystalline semiconductor film), and thus variations in characteristics between transistors can be suppressed. A transistor formed using a single crystalline semiconductor film is superior in all operation characteristics such as current driving ability, to an amorphous silicon transistor. Thus, the transistor can be downsized, which leads to increase of an aperture ratio of a pixel portion in the display panel. As a result, high quality display can be achieved.

Embodiment Mode 6 can be combined with any of the structures described in Embodiment Modes 1 to 5, as appropriate.

Embodiment Mode 7

In Embodiment Mode 7, a wide variety of electronic devices manufactured using the present invention is described with reference to FIGS. 15A to 15F. Examples of the electronic devices include: television devices (also referred to as simply, televisions or television receivers), cameras such as video cameras or digital cameras, goggle displays (head mounted displays), navigation systems, audio reproducing devices (e.g., car audio component stereos and audio component stereos), laptop personal computers, game machines, portable information terminals (e.g., mobile computers, mobile phones, portable game machines, and electronic books), image reproducing devices provided with recording media (specifically, the devices that can reproduce content of a recording medium such as a digital versatile disc (DVD) and are provided with a display device capable of displaying the reproduced images), and the like. Preferred modes thereof will be explained with reference to FIGS. 15A to 15F.

Figure 15A:
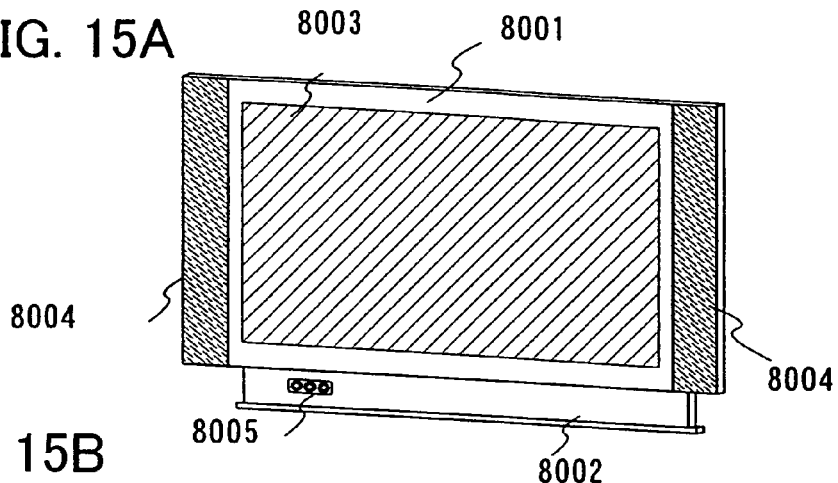
FIGS. 15A to 15F illustrate examples of electronic devices according to an aspect of the present invention.

FIG. 15A shows a display device, which includes a chassis 8001, a support stand 8002, a display portion 8003, speakers 8004, video input terminals 8005, and the like. The liquid crystal display device described in FIGS. 13A and 13B or the light-emitting device described in FIGS. 14A and 14B can be used in the display portion 8003, and an image with high image quality can be displayed. It is to be noted that the display device includes all devices for displaying information, for example, for a personal computer, for receiving TV broadcasting, and for displaying an advertisement.

Figure 15B:
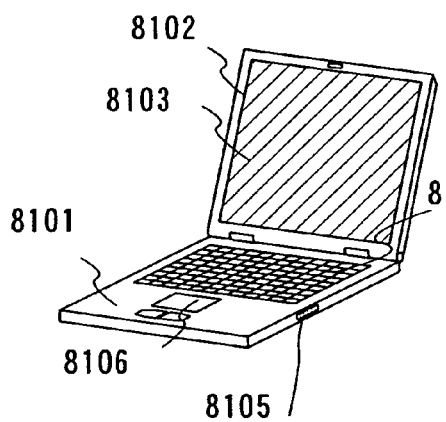

FIG. 15B shows a laptop personal computer, which includes a main body 8101, a chassis 8102, a display portion 8103, a keyboard 8104, an external connection port 8105, a mouse 8106, and the like. The liquid crystal display device described in FIGS. 13A and 13B or the light-emitting device described in FIGS. 14A and 14B can be used in the display portion 8103, and an image with high image quality can be displayed.

Figure 15C:
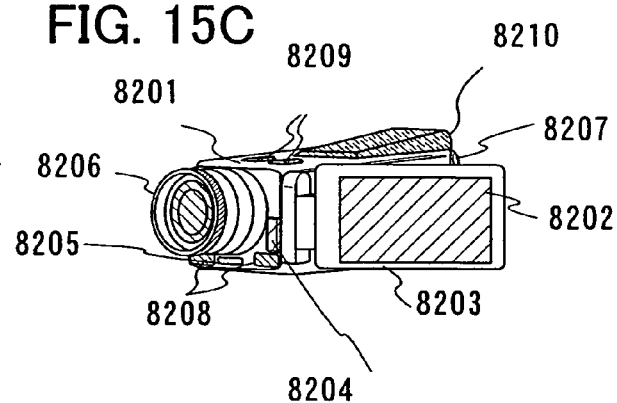

FIG. 15C shows a video camera, which includes a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. The liquid crystal display device described in FIGS. 13A and 13B or the light-emitting device described in FIGS. 14A and 14B can be used in the display portion 8202, and an image with high image quality can be displayed.

Figure 15D:
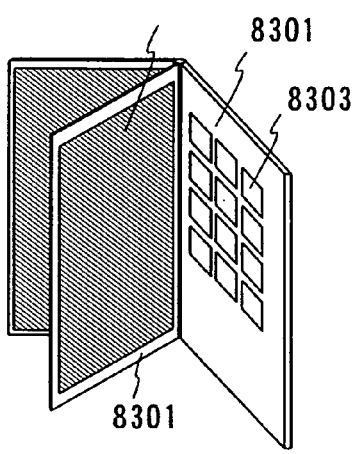

FIG. 15D shows an electronic book, which includes a main body 8301, a display portion 8302, an operation key 8303, and the like. A modem may be built in, or a structure in which information can be transmitted and received wirelessly may be employed. In a memory portion of the electronic book, a NOR-type nonvolatile memory with a memory capacity of 20 gigabytes (GB) to 200 gigabytes (GB) can be used, with which images or sounds (music) can be stored and reproduced. The microprocessor described in FIG. 10, the RFCPU described in FIG. 11, or the like can be used for the memory portion which stores information of the electronic book or a microprocessor which operates the electronic book. Further, the liquid crystal display device described in FIGS. 13A and 13B or the light-emitting device described in FIGS. 14A and 14B can be used in the display portion 8302, and an image with high image quality can be displayed.

Figure 15E:
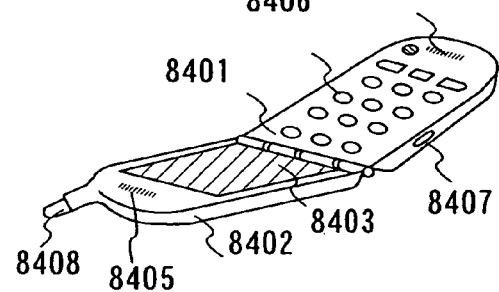

FIG. 15E shows a mobile phone, which includes a main body 8401, a chassis 8402, a display portion 8403, an audio input portion 8404, an audio output portion 8405, operation keys 8406, an external connection port 8407, an antenna 8408, and the like. The liquid crystal display device described in FIGS. 13A and 13B or the light-emitting device described in FIGS. 14A and 14B can be used in the display portion 8403, and an image with high image quality can be displayed.

Figure 15F:
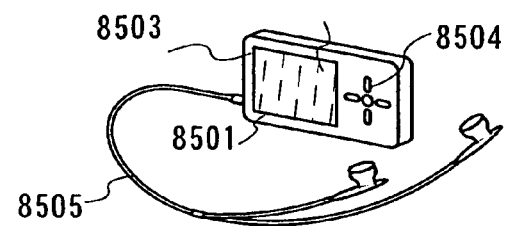

FIG. 15F is a digital audio player, which is a typical example of an audio device. The digital audio player includes a main body 8501, a display portion 8502, a chassis 8503, operation switches 8504, earphones 8505, and the like. Headphones or wireless earphones can be used instead of the earphones 8505. In the digital audio player, the microprocessor described in FIG. 10, the RFCPU described in FIG. 11, or the like can be used in a memory portion which stores music information or a microprocessor which operates the audio digital player. The digital audio player can achieve reductions in size and weight. By application of the liquid crystal display device described in FIGS. 13A and 13B or the light-emitting device described in FIGS. 14A and 14B to the display portion 8502, images or character information with high definition can be displayed even if a screen size is about 0.3 inches to 2 inches.

The electronic devices shown in Embodiment Mode 7 can be implemented in combination with any of the structures shown in Embodiment Modes 1 to 6.

This application is based on Japanese Patent Application serial no. 2007-208932 filed with Japan Patent Office on Aug. 10, 2007, the entire contents of which are hereby incorporated by reference.

What is claimed is:

1. A manufacturing method of an SOI substrate, comprising the steps of:
arranging a plurality of single crystalline semiconductor substrates over a fixing substrate to form a first seed substrate;
arranging a second seed substrate over the first seed substrate so as to be bonded to the first seed substrate, wherein the second seed substrate is formed by a plurality of single crystalline semiconductor substrates each having a first separation layer which is formed by introduction of ions in a region at a predetermined depth from a surface of the second seed substrate;
conducting heat treatment in a state in which the first seed substrate and the second seed substrate are overlapped;
generating a crack in the first separation layer of the second seed substrate, and separating a part of the second seed substrate such that a plurality of first single crystalline semiconductor films are left over the first seed substrate;
forming a second single crystalline semiconductor film by epitaxial growth so as to cover the first single crystalline semiconductor films and a gap between the first single crystalline semiconductor films;
forming a second separation layer by introduction of ions in a region at a predetermined depth from a surface of a third single crystalline semiconductor film including the first single crystalline semiconductor films and the second single crystalline semiconductor film;
attaching a substrate having an insulating surface to the third single crystalline semiconductor film;
conducting heat treatment in a state in which the third single crystalline semiconductor film and the substrate having the insulating surface are overlapped; and
generating a crack in the second separation layer, and separating the fixing substrate, the first seed substrate, and a part of the third single crystalline semiconductor film from the substrate having the insulating surface so that a fourth single crystalline semiconductor film is left over the substrate having the insulating surface.

2. The manufacturing method of an SOI substrate according to claim 1, wherein the fixing substrate is formed by a plurality of single crystalline semiconductor substrate which are tightly arranged on a plane surface.

3. The manufacturing method of an SOI substrate according to claim 1, wherein the fixing substrate and the first seed substrate are each formed by a plurality of single crystalline semiconductor substrates each having the same size which are tightly arranged, and the single crystalline semiconductor substrates forming a part of the first seed substrate are arranged over a gap between the single crystalline semiconductor substrates forming a part of the fixing substrate.

4. The manufacturing method of an SOI substrate according to claim 1, wherein the first seed substrate and the second seed substrate are each formed by a plurality of single crystalline semiconductor substrates each having the same size which are tightly arranged, and the single crystalline semiconductor substrates forming a part of the second seed substrate are arranged over a gap between the single crystalline semiconductor substrates forming a part of the first seed substrate.

5. The manufacturing method of an SOI substrate according to claim 1, wherein the first seed substrate and the second seed substrate are each formed using a plurality of single crystalline semiconductor substrates each having a square shape.

6. The manufacturing method of an SOI substrate according to claim 1, wherein the surface of the third single crystalline semiconductor film is polished.

7. A manufacturing method of a semiconductor device including an SOI substrate formed by the manufacturing method according to claim 1, further comprising the steps of:
- etching the fourth single crystalline semiconductor film to be isolated for each element; and
- forming a transistor including the fourth single crystalline semiconductor film which is isolated for each element by etching.

8. A manufacturing method of an SOI substrate, comprising the steps of:
- arranging a plurality of single crystalline semiconductor substrates over a fixing substrate to form a first seed substrate;
- arranging a second seed substrate over the first seed substrate so as to be bonded to the first seed substrate, wherein the second seed substrate is formed by a plurality of single crystalline semiconductor substrates each having a first separation layer which is formed by introduction of ions in a region at a predetermined depth from a surface of the second seed substrate;
- conducting heat treatment in a state in which the first seed substrate and the second seed substrate are overlapped;
- generating a crack in the first separation layer of the second seed substrate, and separating a part of the second seed substrate such that a plurality of first single crystalline semiconductor films are left over the first seed substrate;
- forming an amorphous silicon film by a CVD method to cover the first single crystalline semiconductor films and a gap between the first single crystalline semiconductor films;
- conducting heat treatment in a state in which the amorphous silicon film and the first single crystalline semiconductor films are overlapped, wherein the amorphous silicon film converts to a single crystalline silicon film which is a second single crystalline semiconductor film;
- forming a second separation layer by introduction of ions in a region at a predetermined depth from a surface of a third single crystalline semiconductor film including the first single crystalline semiconductor films and the second single crystalline semiconductor film;
- attaching a substrate having an insulating surface to the third single crystalline semiconductor film;
- conducting heat treatment in a state in which the third single crystalline semiconductor film and the substrate having the insulating surface are overlapped; and
- generating a crack in the second separation layer, and separating the fixing substrate, the first seed substrate, and a part of the third single crystalline semiconductor film from the substrate having the insulating surface so that a fourth single crystalline semiconductor film is left over the substrate having the insulating surface.

9. The manufacturing method of an SOI substrate according to claim 8, wherein the fixing substrate is formed by a plurality of single crystalline semiconductor substrate which are tightly arranged on a plane surface.

10. The manufacturing method of an SOI substrate according to claim 8, wherein the fixing substrate and the first seed substrate are each formed by a plurality of single crystalline semiconductor substrates each having the same size which are tightly arranged, and the single crystalline semiconductor substrates forming a part of the first seed substrate are arranged over a gap between the single crystalline semiconductor substrates forming a part of the fixing substrate.

11. The manufacturing method of an SOI substrate according to claim 8, wherein the first seed substrate and the second seed substrate are each formed by a plurality of single crystalline semiconductor substrates each having the same size which are tightly arranged, and the single crystalline semiconductor substrates forming a part of the second seed substrate are arranged over a gap between the single crystalline semiconductor substrates forming a part of the first seed substrate.

12. The manufacturing method of an SOI substrate according to claim 8, wherein the first seed substrate and the second seed substrate are each formed using a plurality of single crystalline semiconductor substrates each having a square shape.

13. The manufacturing method of an SOI substrate according to claim 8, wherein the surface of the third single crystalline semiconductor film is polished.

14. A manufacturing method of a semiconductor device including an SOI substrate formed by the manufacturing method according to claim 8, further comprising the steps of:
- etching the fourth single crystalline semiconductor film to be isolated for each element; and
- forming a transistor including the fourth single crystalline semiconductor film which is isolated for each element by etching.

* * * * *